United States Patent [19]

Midya et al.

[11] Patent Number: 6,138,042
[45] Date of Patent: Oct. 24, 2000

[54] METHOD, DEVICE, PHONE, AND BASE STATION FOR PROVIDING AN EFFICIENT TRACKING POWER CONVERTER FOR VARIABLE SIGNALS

[75] Inventors: Pallab Midya, Schaumburg; Lawrence E. Connell, Naperville; John Grosspietsch, Libertyville, all of Ill.; Ronald Gene Myers, Scottsdale, Ariz.

[73] Assignee: Motorola, Inc., Schaumburg, Ill.

[21] Appl. No.: 09/001,625

[22] Filed: Dec. 31, 1997

[51] Int. Cl.[7] .............................. H04Q 7/23; G05F 1/70; H02M 7/155
[52] U.S. Cl. ........................ 455/571; 455/571; 455/403; 323/222; 363/41; 363/97
[58] Field of Search ................................... 455/127, 125, 455/108, 572, 561, 12.1, 427; 330/10; 340/825.63; 375/238, 297, 296; 323/222, 285, 299; 363/41, 97, 351

[56] References Cited

U.S. PATENT DOCUMENTS

| | | | |
|---|---|---|---|
| 5,003,454 | 3/1991 | Bruning | 363/81 |
| 5,041,793 | 8/1991 | Gailus | 330/2 |
| 5,166,871 | 11/1992 | Carroll et al. | 363/56 |
| 5,251,330 | 10/1993 | Chiba et al. | . |
| 5,365,546 | 11/1994 | Koenck et al. | 375/9 |
| 5,396,165 | 3/1995 | Hwang et al. | 323/210 |
| 5,420,536 | 5/1995 | Faulkner et al. | . |
| 5,559,468 | 9/1996 | Gailus et al. | . |
| 5,564,086 | 10/1996 | Cygan et al. | . |
| 5,565,761 | 10/1996 | Hwang | 323/222 |
| 5,581,450 | 12/1996 | Walne | 363/21 |
| 5,689,176 | 11/1997 | Deloy | 323/222 |
| 5,691,889 | 11/1997 | Bazinet et al. | 363/89 |
| 5,801,935 | 9/1998 | Sugden et al. | 363/89 |
| 5,861,734 | 1/1999 | Fasullo et al. | 323/222 |

OTHER PUBLICATIONS

Leonard R. Kahn, "Single–Sideband Transmission by Envelope Elimination and Restoration", Proceedings of the I.R.E. Jul. 1952, pp. 803–806.

Fred Raab and Daniel J. Rupp "Class–S High–Efficiency Amplitude Modulator" GMRR TP93–1: RF Design vol. 17. No. 5 pp. 70–74, May 1994.

F. H. Rabb and D. J. Rupp, "High–Efficiency Single–Sideband HF/VHF Transmitter based upon Envelope Elimination and Restoration", Green Mountain Radio Research Company, USA. pp. 21–25.

PhD Thesis of Pallab Midya, 1995 at University of Illinois at Champaign–Urbana, IL (not enclosed—to be sent upon receipt of a copy).

*Primary Examiner*—Thanh Cong Le
*Assistant Examiner*—Meless Zewdu
*Attorney, Agent, or Firm*—Douglas D. Fekete

[57] ABSTRACT

A method (300, 400), device (100, 200), phone (200) and base station (200) provide an efficient tracking power converter for variable signals. The tracking power converter includes a feedforward feedback control unit that is coupled to receive a reference signal and to receive at least one feedback signal and is used for determining an optimal control signal in accordance with a predetermined scheme, a pulse width modulation unit that is coupled to the feedforward feedback control unit and is used for modifying a duty ratio to provide a switching signal, and a power converter that is coupled to the pulse width modulation unit and to a power source and is used for providing the dynamic variable output signal.

45 Claims, 11 Drawing Sheets

300

302 — UTILIZING AN EFFICIENT ENVELOPE FOLLOWING UNIT FOR OUTPUTTING A SUPPLY VOLTAGE IN ACCORDANCE WITH A VARIABLE ENVELOPE OF AN INPUT BASEBAND SIGNAL

304 — PROVIDING, BY A RF SIGNAL GENERATOR, BASED ON THE INPUT BASEBAND SIGNAL, A RF INPUT SIGNAL WITH AMPLITUDE AND PHASE INFORMATION TO A LINEAR RF POWER AMPLIFIER

306 — UTILIZING A LINEAR RF POWER AMMPLIFIER THAT IS COUPLED TO THE EFFICIENT ENVELOPE FOLLOWING UNIT AND TO THE RF SIGNAL GENERATOR FOR OUTPUTTING A POWER EFFICIENT AMPLIFIED VARIABLE ENVELOPE RF SIGNAL WITH SUBSTANTIALLY A SAME AMPLITUDE AND PHASE INFORMATION AS THE RF INPUT SIGNAL

402 — DETERMINING A FEEDFORWARD-FEEDBACK CONTROL SIGNAL IN ACCORDANCE WITH A PREDETERMINED SCHEME USING A REFERENCE SIGNAL AND AT LEAST ONE FEEDBACK SIGNAL

404 — MODIFYING A DUTY RATIO TO PROVIDE A SWITCHING SIGNAL

406 — PROVIDING THE DYNAMIC VARIABLE OUTPUT SIGNAL

METHOD, DEVICE, PHONE, AND BASE STATION FOR PROVIDING AN EFFICIENT TRACKING POWER CONVERTER FOR VARIABLE SIGNALS

RELATED APPLICATION

The present application is related to the following application which is incorporated herein by reference: U.S. patent application Ser. No. 09/001,762, METHOD, DEVICE, PHONE, AND BASE STATION FOR PROVIDING ENVELOPE FOLLOWING FOR VARIABLE ENVELOPE RADIO FREQUENCY SIGNALS, by Pallab Midya, Lawrence Connell, Steve Gillig, John Grosspietsch, Andrew Merritt Khan, George Francis Opas and Robert Louis Palandech, which is being filed concurrently and which is assigned to Motorola, Inc.

FIELD OF THE INVENTION

The present invention relates to tracking power converters and more particularly to tracking power converters for driving RF power amplifiers.

BACKGROUND OF THE INVENTION

Switched power converters are widely used to convert between DC (direct current) source and load as well as to interface to slowly moving AC (alternating current) inputs and outputs. These uses represent one mode of operation of switched power converters. For the purpose of improving efficiency of RF (radio frequency) power amplifiers, a variable supply is used to power the amplifier. The switched power converter providing the variable supply must have a high efficiency, very low switching noise, high bandwidth and slew rate. This represents a different mode of operation for a switched power converter. Using conventional control schemes which have been developed for essentially DC sources and loads, these objectives can be met only by switching at a rate much higher than the envelope bandwidth, resulting in lower efficiency and EMI (electromagnetic interference) problems. Previous attempts have also been made to increase the bandwidth of the switched power converter by using a frequency equalizer to increase the power converter input amplitude as the input frequency increases and thereby improve the high frequency characteristics of the power converter. Unfortunately, it is impractical to manufacture in high volume a sufficiently good match between the equalizer and the power converter frequency characteristics. To increase the bandwidth of the switched power converter while still operating at a reasonable switching frequency, a method, device, phone and base station are needed specifically for tracking a dynamic variable output signal.

BRIEF DESCRIPTION OF THE DRAWINGS

FIG. 3 is a flow chart showing one embodiment of steps of a method for providing a tracking power converter that provides efficient power amplification while generating a dynamic variable output signal in accordance with the present invention.

FIG. 4 is a flow chart of one embodiment of steps of a method for providing an efficient linear power amplifier that generates a variable envelope radio frequency RF signal in accordance with the present invention.

FIG. 13 shows the schematic representation of a conventional pulse width modulator PWM converter as is known in the art.

DETAILED DESCRIPTION OF A PREFERRED EMBODIMENT

Figure 1:
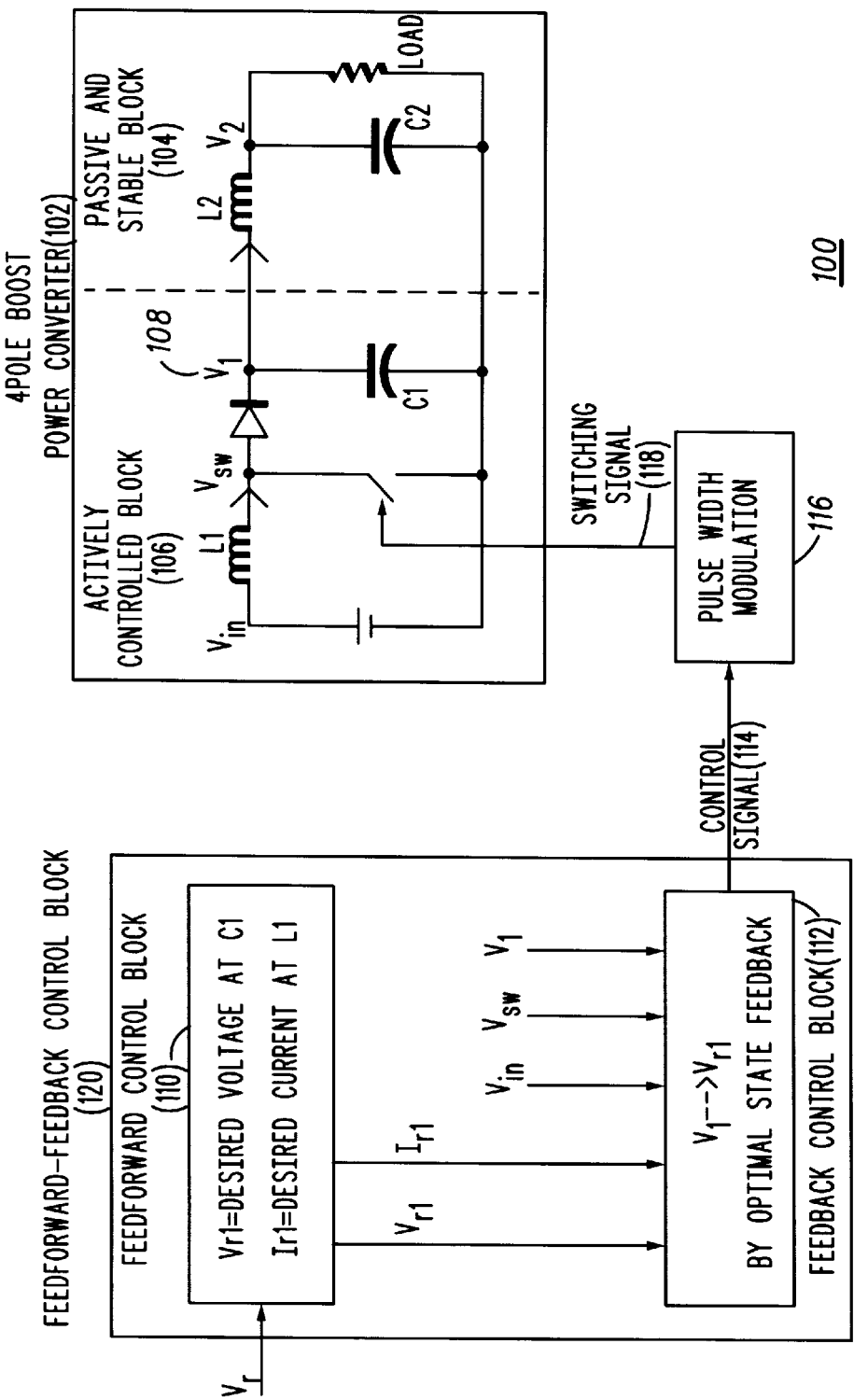
FIG. 1 is a schematic representation of the feedback feedforward control scheme for a four pole boost converter in accordance with the present invention.

FIG. 1, numeral 100, is a schematic representation of the feedforward feedback control scheme for a four pole boost power converter (102). The switcher has been partitioned into passive (104) and actively (106) controlled blocks. The stability of the passive block is guaranteed. If any one state of this block is controlled then the entire block is controlled. Here the node common to the two blocks (V1; 108) is controlled. A feedforward-feedback control block (120) includes a feedforward control block (110) and a feedback control block (112). The feedforward control block (110)

takes the output voltage reference and converts it to reference values for the actively controlled block. In the feedback control block (112) the intermediate voltages are used along with the reference voltages to generate the control signal. This control signal goes to a conventional pulse width modulation (PWM; 116) block that generates the switching signal (118). The control action drives the intermediate node V1 to its reference value.

Figure 2:
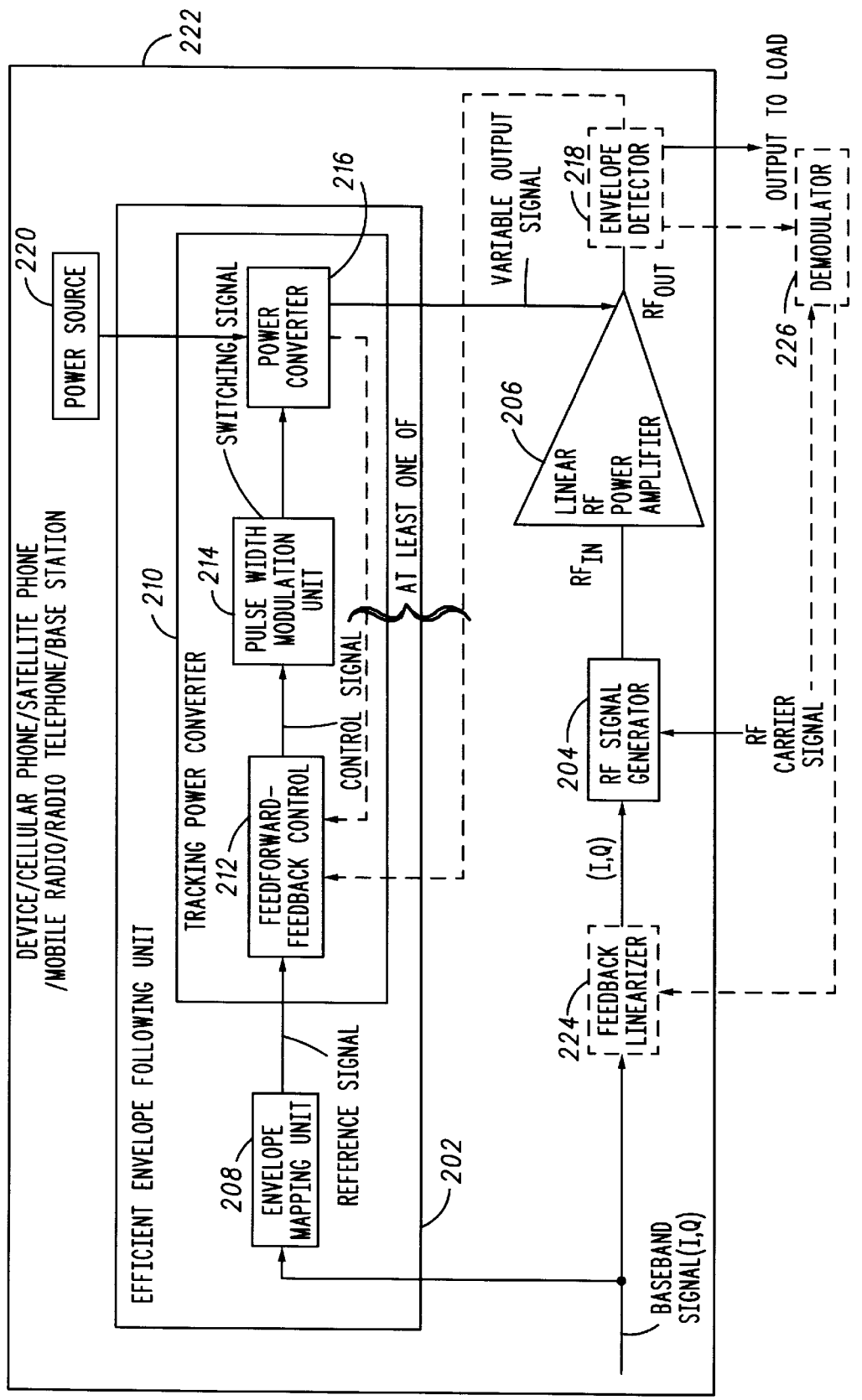
FIG. 2 is a block diagram of one embodiment of a device having a tracking power converter that provides efficient power amplification while generating a dynamic variable output signal in accordance with the present invention.

FIG. 2, numeral 200, is a block diagram of one embodiment of a device (222) having a tracking power converter (210) that provides efficient power amplification while generating a dynamic variable output signal. The tracking power converter (210) includes: A) a feedforward feedback control unit (212), coupled to receive a reference signal and to receive at least one feedback signal, for determining an optimal control signal in accordance with a predetermined scheme; B) a pulse width modulation unit (214), coupled to the feedforward feedback control unit (212), for modifying a duty ratio to provide a switching signal; and C) a power converter (216), coupled to the pulse width modulation unit (214) and to a power source (220), for providing the dynamic variable output signal.

An envelope following unit (208) receives a baseband signal and provides the reference signal to the tracking power converter.

Generally, a linear RF power amplifier (206), typically a class AB amplifier or a class B amplifier, is coupled to receive the dynamic variable output signal.

At least one feedback signal is generally sent to the feedforward feedback control unit (212). The tracking power converter (210) may provide a feedback signal and/or an envelope detector (218) coupled to the linear RF power amplifier (206) output may provide a feedback signal to the feedforward feedback control unit (212).

Where selected, the tracking power converter (210) includes a filter of order greater than 2 or may include a filter that is an optimal low-pass filter of order greater than two.

The envelope mapping unit (208) may use a polynomial mapping function of $I^2$ plus $Q^2$, which is a square of the envelope of the baseband signal to provide an implicitly bandlimited signal.

The device (222) is typically implemented in a cellular phone, a satellite phone, a mobile radio, a radio telephone, a base station or the like.

FIG. 3, numeral 300, is a flow chart of one embodiment of steps of a method for providing an efficient linear power amplifier that generates a variable envelope RF signal in accordance with the present invention. The steps include: A) utilizing (302) an efficient envelope following unit for outputting a supply voltage in accordance with a variable envelope of an input baseband signal; B) providing (304), by a RF signal generator, based on the input baseband signal, a RF input signal with amplitude and phase information to a linear RF power amplifier; and C) utilizing (306) a linear RF power amplifier that is coupled to the efficient envelope following unit and to the RF signal generator for outputting a power efficient amplified variable envelope RF signal with substantially a same amplitude and phase information as the RF input signal.

As shown in FIG. 4, numeral 400, in another embodiment of the method of the present invention, the method includes the steps of: A) determining (402) a feedforward-feedback control signal in accordance with a predetermined scheme using a reference signal and at least one feedback signal; B) modifying (404) a duty ratio to provide a switching signal; and C) providing (406) the dynamic variable output signal.

Typically, the predetermined scheme may include utilizing an estimate of a load current based on the reference signal to determine the feedforward-feedback control signal or utilizing the reference signal and derivatives of the reference signal to determine the feedforward-feedback control signal. The reference signal is generally available in digital form, and the derivatives of the reference signal are computed using digital hardware.

The feedback signal may be provided to the feedforward feedback control unit by the power converter, or alternatively, an envelope detector coupled to the linear RF power amplifier output may provide a feedback signal to the feedforward feedback control unit. In another embodiment both feedback signals may be utilized.

As is set forth for the device, in the method the envelope tracking power converter may typically include a filter of order greater than 2.

Envelope following is characterized by a variable supply to the RF power amplifier, and a RF input signal that is unmodified and has phase as well as amplitude information. Since the supply does not directly determine the output amplitude, the supply voltage can be chosen to optimize performance.

The first step in creating the control voltage for the power converter is to create the envelope signal from baseband (I,Q) signals. The ideal envelope is simply $$\sqrt{I^2 + Q^2}$$

This is a signal with an extremely large small signal bandwidth. Also the computation of the square root function is computationally intensive. Thus alternate methods to create the envelope signal are required.

Figure 5:
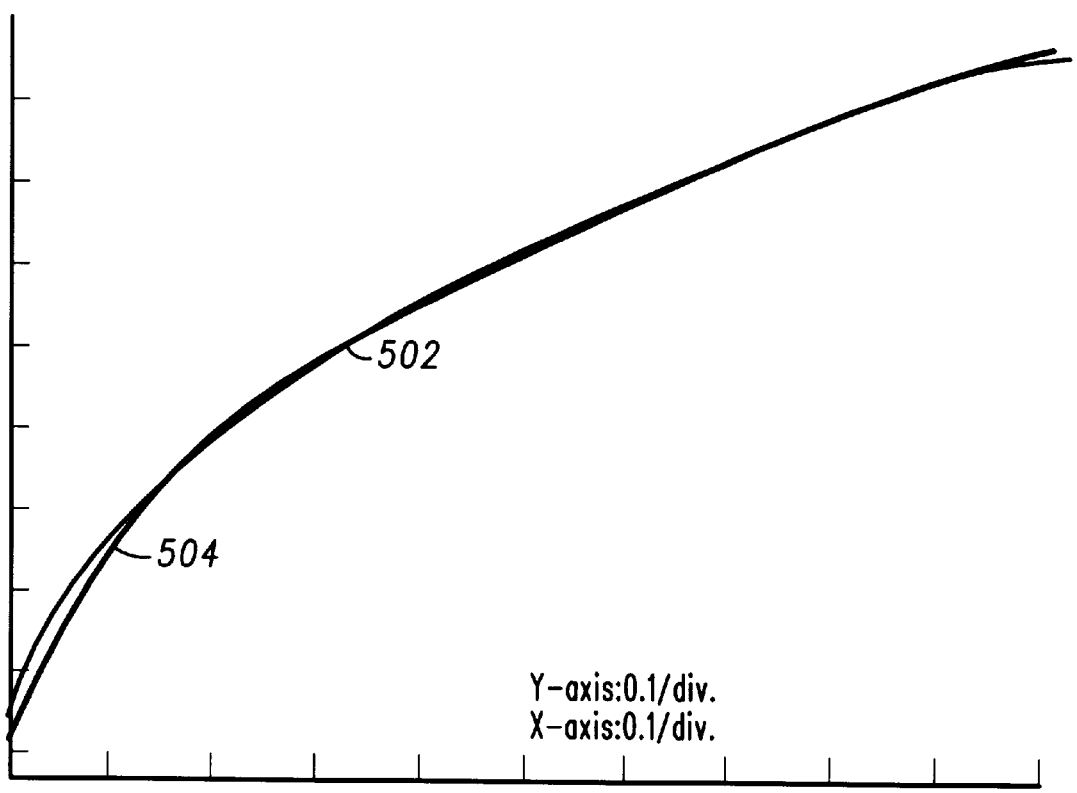
FIG. 5 is a graphical representation comparing the approximate square root used for the envelope supply mapping to the ideal square root function.

In FIG. 5, numeral 500, an approximate square root (504) used for the envelope supply mapping is compared to the ideal square root function (502). The following section shows the analysis of a polynomial mapping function that maps the ideal square root function to the approximate square root.

The envelope is defined in terms of the baseband signals (I,Q).

$$\text{Envelope} = \sqrt{(I^2 + Q^2)} = x \qquad (1)$$

Define the supply to the RF PA to be y. Computing a square root is a computationally intensive operation. Thus, the supply may be computed as a function of the envelope squared.

$$\text{Supply} = y = f(x^2) \qquad (2)$$

Consider a fourth order polynomial mapping function of the envelope squared. Since the baseband (I,Q) signals are band limited to $F_{channel}$ the supply bandwidth in this case would be limited to 8 ($F_{channel}$).

$$y = a_0 + a_2 x^2 + a_4 x^4 + a_6 x^6 + a_8 x^8 \qquad (3)$$

Figure 6:
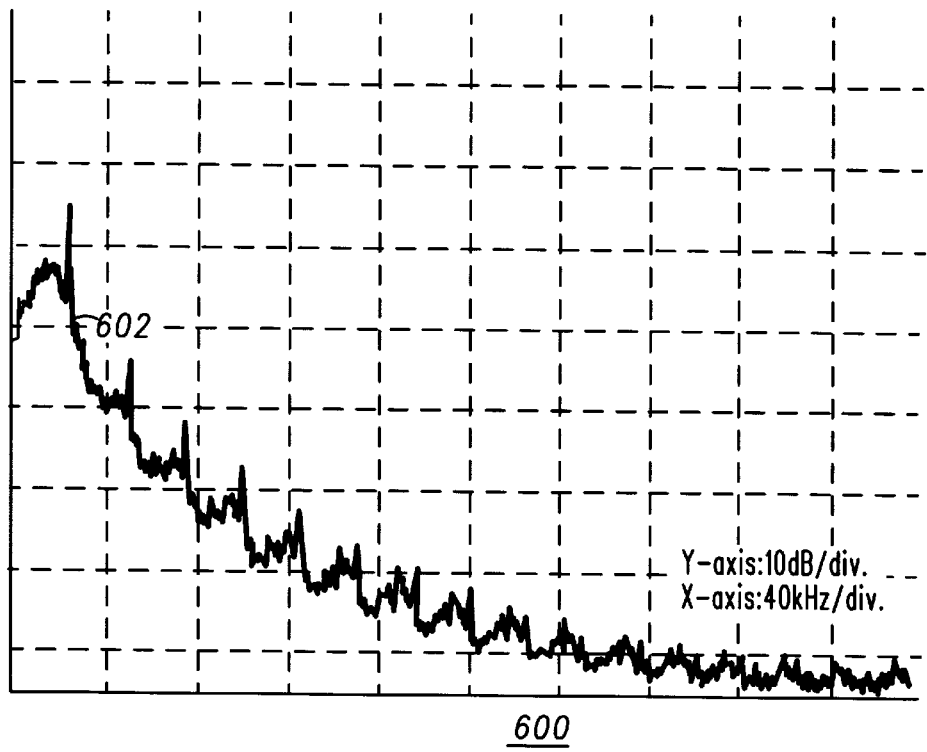
FIG. 6 is a graphical representation showing the ideal envelope spectrum for a 25 kHz QPSK signal.
Figure 7:
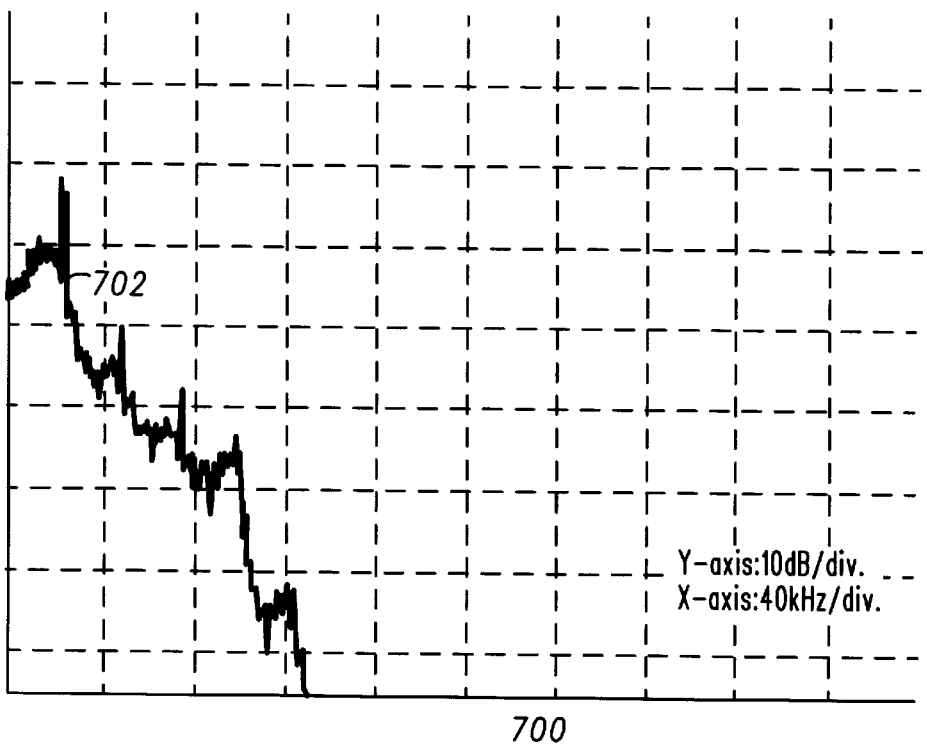
FIG. 7 is a graphical representation showing the spectrum of the polynomial mapped function for the 25 kHz QPSK signal.

The polynomial approximates the square root very closely. However, the small difference between the two signals results in a large difference in the bandwidth of the signals. This difference is shown clearly in the graphical representations of the ideal envelope and the polynomial mapped spectra (602) in FIG. 6, numeral 600 and FIG. 7, numeral 700, respectively. The signal used here is a 25 ksps QPSK signal used in a satellite subscriber phone application.

Here the error power has been minimized. Other functions may be minimized using the same algorithm. Obviously this would result in different polynomial coefficients. However, the algorithm taught here may be used without any changes. It is interesting to note that the linear term proportional to the envelope has been completely eliminated. This is a significant departure from all prior art that uses the linear term only for supply and bias modulation.

Certain power converters are limited in the range of output voltages that they can produce. For example, a boost converter can only produce voltages greater than the input voltage. Therefore, the envelope to supply mapping must have a lower limit equal to the input voltage. If a hard lower limit is imposed on the mapped outputs, abrupt transistions are created in the envelope to supply mapping output. This results in high frequency components that are undesirable.

This problem may be resolved by using a polynomial mapping as follows. An idealized linear mapping of envelope to supply is chosen. The lower bound is then introduced into this mapping function. This results in a piecewise linear function. A least squares estimator is used to approximate the piecewise linear function by an even polynomial of the baseband envelope. Thus we obtain a polynomial of $(I^2+Q^2)$.

This method allows the use of boost converters for envelope following applications. There has been a migration of cellular phones and other portable communication systems to lower voltage batteries. In the future further lowering of this voltage is anticipated as a single cell battery system is approached. In this context, the ability to use a simple boost converter for envelope following is of considerable advantage. The RF power amplifier could then be operated at higher supply voltage than the battery. This would allow the use of higher voltage RF power amplifiers that have lower cost, higher efficiency and are readily available at this time.

The linearity of a linear RF power amplifier may be characterized by its gain and phase variation in response to amplitude variations. Thus, if an amplifier has little gain and phase variation in response to the entire range of amplitudes applied, it has high linearity. This results in a spectrum that has little splatter into the adjacent channels. In most radio systems, there are strict limits on the amount of splatter interfering with the adjacent channel, resulting in strict limits on the gain and phase variations allowed in a RF power amplifier.

For any RF power amplifier the linearity is a critical issue. Once the modulation is chosen, the way to improve linearity is by improving the RF power amplifier. Alternate methods to improve linearity include predistortion and feedback linearization. Unfortunately, all these methods increase power consumption and lower efficiency. In the context of an envelope following system, the choice of the envelope to supply mapping can affect the amount of gain and phase variation. For example, the phase variation is increased dramatically if the supply voltage is close to zero. The envelope of the RF signal in many modulation schemes periodically goes through a zero. If the supply is just proportional to the envelope, this would result in large phase variations. This would result in significant nonlinearity and adjacent channel splatter. To avoid this scenario, zero avoidance techniques have been developed that prevent the RF envelope from approaching zero This solves the linearity problem at the cost of significant increase in system complexity.

The improved envelope to supply mapping, as described above for a boost converter, can accomplish the zero avoidance without changing the envelope of the RF signal. Here, the envelope of the RF signal is allowed to go to zero, but the supply is prevented from going to zero. This is effectively a zero avoidance strategy for envelope following systems. There is negligible difference in power consumption by the RF power amplifier associated with the zero avoidance. Thus, the linearity improvement obtained is not at the cost of power consumption.

It is also possible to limit gain variations by using other appropriate envelope to supply mappings. The gain of the RF power amplifier is a function of the input RF signal envelope and the supply voltage. Consider a Cartesian coordinate system with the signal envelope and the supply voltage as the axes. In this plane a locus of points is plotted for constant gain. This plot can be interpreted as a piecewise linear function for the supply to envelope mapping. Again, this piecewise linear function may be approximated as a polynomial of the envelope squared.

In one embodiment, the device of the present invention may be utilized in a multi-mode radio telephone having a system for providing an efficient linear power amplifier that generates at least a variable envelope RF signal. The system includes: A) an efficient envelope following unit (202), coupled to receive a baseband signal, for outputting a supply voltage in accordance with one of: a variable envelope of the baseband signal and a constant envelope of the baseband signal; B) a RF signal generator (204), coupled to receive the baseband signal and a RF reference signal, for providing a RF input signal with amplitude and phase information to a linear RF power amplifier; and C) the linear RF power amplifier (206), coupled to the efficient envelope following unit (202) and to the RF signal generator (204), for outputting one of: a power efficient amplified variable envelope RF signal with substantially a same amplitude and phase information as the RF input signal based on the variable envelope of the baseband signal; and a power efficient amplified constant envelope RF signal with substantially a same amplitude and phase information as the RF input signal based on the constant envelope of the baseband signal. Clearly, this embodiment of the invention provides a flexibility for utilizing the multi-mode radio telephone in any one of a plurality of modes, depending on the choice of the user. The choice may be based on availability of a particular mode, or alternatively, on a price differential in selection of modes.

Figure 8:
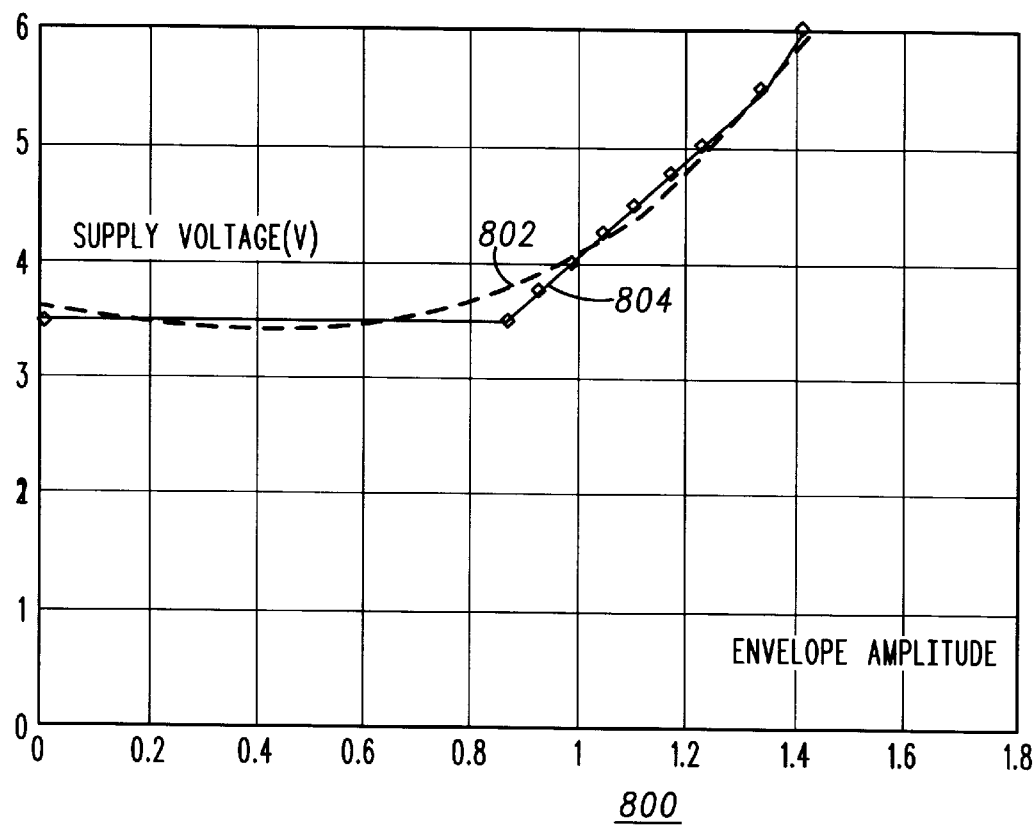
FIG. 8 shows a graphical representation of the envelope to supply mapping incorporating a voltage limit for a boost converter and constant gain for the RF power amplifier MHW920.

In FIG. 8, numeral 800, the envelope to supply mapping (802) incorporating a voltage limit for a boost converter and constant gain for the RF power amplifier MHW920 is shown graphically. The mapping is obtained as a curve-fit to equal gain data points (804). This is a RF power amplifier designed to operate at a nominal supply of 6 V. A boost converter using the envelope to supply mapping shown may be used to operate this power amplifier from a 3.6 V battery. This would result in significant power savings while allowing the migration to a lower voltage battery. Here, a low order polynomial has been chosen for the mapping further limiting the supply bandwidth requirements.

Envelope following is expected to affect the linearity of the RF power amplifier. The data in the following tables was taken to ensure that there is little degradation in signal quality which is well within acceptable amounts. TABLE 1, shown below, shows the adjacent and alternate channel power levels with and without supply modulation. Note that this data was taken with a switcher providing the supply modulation. The envelope was generated by detecting the RF signal, and this introduced a time delay of 2–4 $\mu$s between the envelope and the supply. This much delay in EER (envelope elimination and restoration) would be quite unacceptable. This illustrates the robustness of the envelope following approach

TABLE 1

ADJACENT CHANNEL COUPLED POWER DATA

| | Envelope-Following | | Fixed Supply | | |
|---|---|---|---|---|---|
| | Upper | Lower | Upper | Lower | Condition |
| adjacent-channel power | −31.6 dB | −32.5 dB | −34.7 dB | −33.5 dB | Modulation Only |
| alternate-channel power | −47.5 dB | −49.1 dB | −50.5 dB | −50.9 dB | |
| adjacent-channel power | −31.6 dB | −32.5 dB | −34.7 dB | −33.5 dB | Modulation & Transient |
| alternate-channel power | −47.5 dB | −48.4 dB | −50.0 dB | −50.0 dB | |
| adjacent-channel power | −27.4 dB | −27.4 dB | −31.6 dB | −31.3 dB | Worst-Case Load Mismatch |
| alternate-channel power | −48.6 dB | −43.8 dB | −47.7 dB | −48.2 dB | |

There was also some concern that envelope following would affect the demodulated signal. The experimental data in TABLE 2 (shown below) indicates that there is little signal degradation. It was possible to use a very aggressive envelope that maximized the power savings, and the in band signal degradation was still insignificant. However, this degraded adjacent splatter that may not be acceptable in certain radio systems.

TABLE 2

ERROR VECTOR MAGNITUDE DATA FOR 25 ksps OFFSET QPSK SYSTEM

| | Envelope Following | | | Fixed Supply | | |
|---|---|---|---|---|---|---|
| Condition | EVM (rms) | Mag error | Phase err. | EVM (rms) | Mag error | Phase err. |
| Steady State | 4.0% | 3.0% | 1.3 deg. | 2.3% | 1.9% | 1.0 deg. |
| First 10 symbols of burst | 4.8% | 3.5% | 1.8 deg. | 4.0% | 3.1% | 1.4 deg. |
| Aggressive Envelope-Following | 4.3% | 3.0% | 1.5 deg. | | | |

Figure 9:
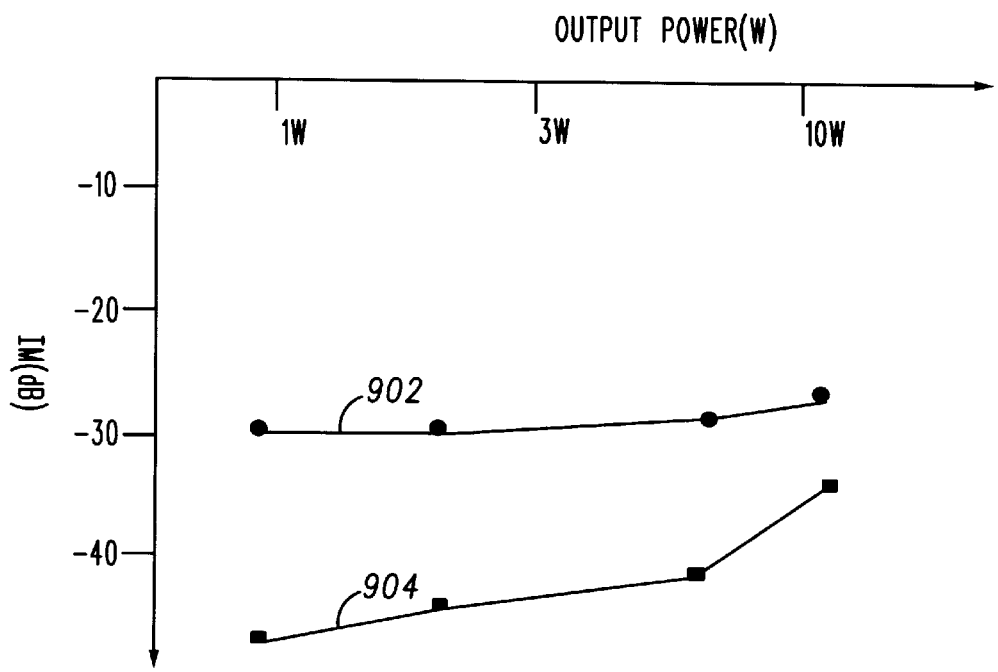
FIG. 9 shows a graphical representation of the IM (intermodulation) performance of the RF power amplifier MHW913 for a 10 kHz two tone signal with envelope following in accordance with the present invention.
Figure 10:
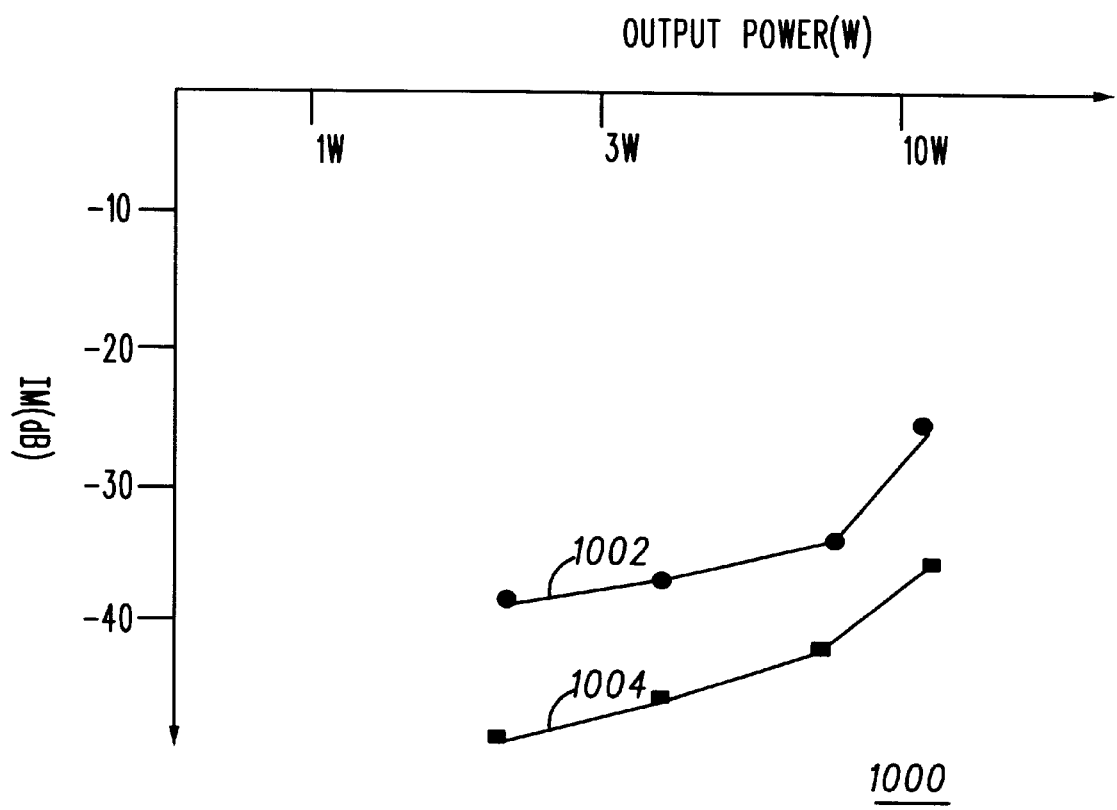
FIG. 10 shows a graphical representation of the IM (intermodulation) performance of the RF power amplifier MHW913 for a 10 kHz two tone signal with envelope following with a fixed supply.

Another envelope following circuit was built that had the ability to handle more power (~10 W RF average output power compared to ~1 W for MHW920). FIG. 9, numeral 900, shows a graphical representation of the IM (intermodulation) performance of the third (902) and fifth (904) IM of the MHW 913 for a 10 kHz two tone signal with envelope following in accordance with the present invention. This data compares favorably with FIG. 10, numeral 1000, which shows a graphical representation of the IM performance of the third (1002) and fifth (1004) IM of the MHW 913 with fixed supply. Note that envelope following resulted in worse IM at lower power levels, but the IM was not significantly affected at the highest power level. Thus, the worst case IM is not affected, and for a given IM specification the envelope following system performs just as well as the system without supply modulation.

These results indicate that the envelope following scheme is applicable over a range of output powers and for different semiconductor technologies used in RF power amplifiers.

Switched power converters are widely used to convert between DC source and load as well as to interface to slowly moving AC inputs and outputs. These represent one mode of operation of switched power converters. For the purpose of improving efficiency of RF power amplifiers, a variable supply is used to power the amplifier The switched power converter providing the variable supply must have a high efficiency, very low switching noise, high bandwidth and slew rate. This represents a different mode of operation for a switched power converter. Using conventional control schemes which have been developed for essentially DC sources and loads, these objectives can be met only by switching at a rate much higher than the envelope bandwidth. This results in lower efficiency and EMI problems. To operate the switcher at a reasonable switching frequency, new control schemes have been designed specifically for envelope tracking power supplies.

Switched power converters with higher order filters have less switching noise and more bandwidth with appropriate feedback. This is analogous to analog and digital filters where higher order filters are used to obtain a better separation between the pass band and stop band. Here, the switching noise is in the stop band and has to be suppressed while the envelope is the pass band and has to be tracked with little or no distortion.

Any subset of the switcher, not including the switch, is a convergent and stable circuit since it is just a network of R-L-C elements. This arises from the natural damping of the storage elements and the load. For such a convergent and stable circuit there are no unstable modes or eigen vectors. If any state or states in this stable circuit are convergent, all other states must be convergent. If any state or states are controlled, all other states are controlled. Therefore, driving a single state or combination of states in this subset, to their desired values, results in a convergent system. This is especially useful in controlling a switcher with a higher order filter. Further, the filter may be chosen to be critically damped for improved transient response.

The fastest response from a PWM system is obtained by using the equal slope criteria: the control signal slope equals ramp slope when the switch is off. The duty ratio in any cycle is a function of the current system state and the previous duty ratios. This inter-symbol memory is set to zero when the equal slope criteria is satisfied. This is a known result in DC to DC converters, but its effect is more pronounced for a envelope following converter. Unfortunately the slope criteria cannot be met for a variable output voltage. Here, the slope criteria is met for the average output voltage only.

The AC part of the inductor currents may be estimated by the integral of the voltage across it. This fact is used here in the control of the switched power converter. This eliminates the necessity to sense currents. Current sensing introduces noise problems and reduces converter efficiency and complexity.

Consider a buck or a boost converter with a four pole filter. The desired voltage at the output is defined to be $V_r$ and is a known variable. This value is continuous and differentiable to an arbitrary order. This is different from most power converters that have a fixed reference voltage, and all its derivatives are identically zero.

A partitioning may be done: dividing the switched power converter into a linear passive filter and a switched power converter of lesser number of states. The desired voltage at the load and an estimate of the load current allows one to obtain the desired states at each of the storage elements. For the partition not containing the switch, if one or more of the states are set to their desired value, a stable and convergent system results.

The load current (PA supply current) is approximately proportional to the RF envelope. This is a major departure from the domain of the DC to DC converter where the load current is supplied by the user and no data is available about the load current. The load current is known and can be estimated though with significant variations. This estimate may be used as a feedforward signal to modify the duty ratio before it affects the output voltage. Here the reference voltage and output voltage are varying, and there is a capacitor current that must be supplied by the switcher, and again this current may be estimated.

Figure 11:
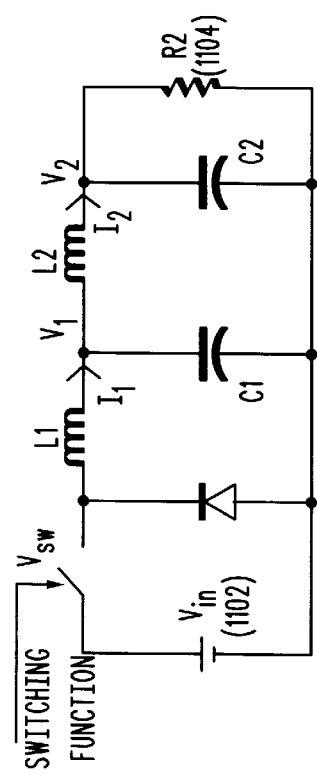
FIG. 11 shows a schematic representation of an embodiment of a buck converter with a four pole filter in accordance with the present invention.

In the following description, buck and boost converters, both with fourth order filters, are introduced. In a buck converter as shown in FIG. 11, the switches are adjacent to the source while the entire filter is on one side. Thus, the partition containing the filter contains all the storage elements. This is a favorable situation and allows any state or combination of states to be controlled. To obtain good start-up performance, the energy stored in power converter is selected as the quantity to be controlled. This choice is motivated by the fact that energy is (subject to minute losses in the storage elements) conserved in a power converter, and any energy imbalance should be controlled. This is analogous to full state-feedback used in control theory. This method of control is introduced here as the Excess Energy Control.

The condition for stability of this control is that the energy stored in the converter may be controlled using the feedback scheme. For a high switching frequency the change in stored energy is small for each switching cycle. In this scenario, the energy stored in the input inductor has the most variation, and the feedback is chosen to handle this change. The change in other components is considered as a perturbation. The equal slope criteria is chosen for maximum stability ignoring these perturbations. Simulations indicate that this results in a stable and robust controller.

Figure 12:
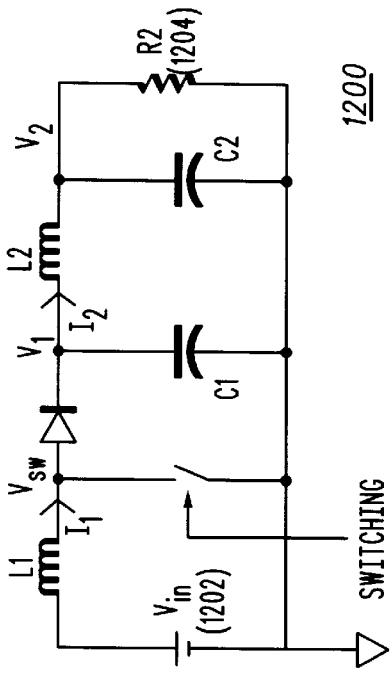
FIG. 12 shows a schematic representation of an embodiment of a boost converter with a four pole filter in accordance with the present invention.

In a boost converter, as shown in FIG. 12, with the switch being a part of the filter, it is not possible to partition the switcher into a switch and a filter. The input inductor and capacitor along with the switch form one block while the output inductor, capacitor and load form the other block in the partition. The control strategy is to drive the voltage at the partition (the voltage at capacitor C1) to the desired voltage. The controller works by using feedback from within the block. The desired voltage at the partition is determined based on an estimate of the load current. Again, the equal slope criteria is chosen for maximum stability using the inductor current as the principal feedback term and the capacitor voltage feedback is assumed to be a perturbation. A closed form stability criteria is generated and used to design the feedback network. This method of control is introduced here as the Feedforward Feedback Control.

Simpler control schemes exist for the buck converter, which has the distinction that the switching circuit is topologically separate from the filter network. For this converter, the Feedforward Feedback Control reduces to feedforward control only. However, feedback can be added to this scheme for linearization of the RF power amplifier.

The inductor currents are estimated using inductor voltages. The capacitor currents are known as a derivative of the voltage. The ideal inductor currents are determined by the capacitor voltages and are determined as follows. The ideal voltage for the output voltage is obviously the reference voltage. In FIG. 11 the state variables are I1, I2, V1 and V2 and their desired values are $I_{r1}$, $I_{r2}$, $V_{r1}$ and $V_{r2}$ respectively.

$$V_{r2} = Vr \quad (4)$$

The ideal current flowing through inductor L2 is a function of the reference voltage and its derivative. The load impedance R is assumed to be known.

$$I_{r2} = \frac{Vr}{R} + C_2 \dot{V}r \quad (5)$$

The ideal voltage at the capacitor C1 may be calculated as a function of the reference voltage, its higher order derivatives and the load resistance.

$$V_{r1} = Vr + L_2 \dot{I}_{r2} = Vr + L_2\left(\frac{\dot{V}r}{R} + C_2 \ddot{V}r\right) \quad (6)$$

The ideal current flowing through inductor L1 is similarly obtained. These values will be used to come up with a suitable control signal for the PWM converter that drives the switches.

$$\begin{aligned} I_{r1} &= I_{r2} + C_1(\dot{V}r_1) \\ &= \frac{Vr}{R} + C_2 \dot{V}r + C_1\left(\dot{V}r + L_2\left(\frac{\ddot{V}r}{R} + C_2 \dddot{V}r\right)\right) \\ &= \frac{Vr}{R} + \dot{V}r(C_1 + C_2) + \frac{\ddot{V}r}{R}L_2 C_1 + L_2 C_1 C_2 \dddot{V}r \end{aligned} \quad (7)$$

In this setup, the currents are not measurable. However, the integral of the inductor voltage may be used as a measure of the inductor current. This is used to get an estimate of the inductor currents which is accurate in an ac sense. For the purpose of control the DC part is not significant. With the reference and actual capacitor voltages and inductor currents known, the control problem is to come up with an appropriate duty ratio to drive the power switch. To maintain a fixed switching frequency a conventional PWM circuit is used.

In the Excess Energy Control there is a single control input: the duty cycle of the switch. Thus it is possible to control only one quantity in the converter. Thus, any error in the states of the system have to be combined into one scalar quantity that may then be controlled by the duty ratio. The ideal power converter is a nondissipative system. Energy imbalance in any storage component (inductor current or capacitor voltage) may be transferred to another component or transferred to the load but is otherwise conserved in the system. Thus, the logical scalar measure of the system state is given by the difference between the energy stored and the energy stored if all the states are at their reference values. The energy difference due to the inductors is defined as EL, due to the capacitors as EC and the sum as ELC.

$$E_{LC} = C_1(Vr_1 - V_1)Vnom + C_2(Vr_2 - V_2)Vnom + L_1(Ir_1 - I_1)Inom + L_2(Ir_2 - I_2)Inom \quad (8)$$

To avoid multiplication of system states, an average value of the inductor current and capacitor voltage have been introduced, $I_{nom}$ and $V_{nom}$ respectively, which are a reasonable approximation when an average relation between the output voltage and current is known. For a power amplifier load, the load impedance may be known with 20% accuracy.

The current flowing through an inductor is an integral of the voltage across it divided by the inductance. For a target output voltage and a known input voltage, the inductor current may be estimated. This is also called an observer in control system literature.

$$-L_2 I_2 = \int (Vr_2 - V_1) dt = \int (Vr - V_1) dt \quad (9)$$

$$-L_1 I_1 = \int (V_1 - Vsw) dt \quad (10)$$

The overall energy error may be obtained by substituting these current estimates. The other terms are expanded in terms of the reference voltage and its derivatives. Again, the load resistance value is being assumed.

$$E_L = (\int (Vr-Vsw)dt + L_1 Ir_1 + L_2 Ir_2) Inom \quad (11)$$

$$L_1 Ir_1 + L_2 Ir_2 = L_1 \left( \frac{Vr}{R} + \dot{V}r(C_1+C_2) + \frac{\ddot{V}r}{R}L_2 C_1 + L_2 C_1 C_2 \dddot{V}r \right) + \quad (12)$$
$$L_2 \left( \frac{Vr}{R} + C_2 \dot{V}r \right)$$

$$E_C = \left( C_1(Vr-V_1) + C_2(Vr-V_2) + C_1 L_2 \left( \frac{\dot{V}r}{R} + C_2 \ddot{V}r \right) \right) Vnom \quad (13)$$

The signals may be combined as a sum of an integral of intermediate voltages, capacitor voltages, the reference voltage and its higher order derivatives. The overall signal may be represented as follows.

$$E_{LC}=(\int(Vr-Vsw)dt)Inom+(C_1(Vr-V_1)+C_2(Vr-V_2))Vnom+(aVr+b\dot{V}r+c\ddot{V}r+d\dddot{V}r)Inom \quad (14)$$

where the coefficients a, b, c and d are given by the following equations:

$$a = \frac{(L_2+L_1)}{R} \quad (15)$$

$$b = (L_1 L_2)(C_1+C_2)R \quad (16)$$

$$c = \frac{L_1 L_2 C_1}{R} + L_2 C_1 C_2 R \quad (17)$$

$$d = L_1 L_2 C_1 C_2 \quad (18)$$

This scalar function of the energy may be used as a control signal to set the duty ratio of the PWM converter. The control signal is compared to the ramp. The criteria for steady state optimal behavior is that the ramp slope equal the control signal slope when the switch is off. In steady state the slope of ELC is determined almost completely by the integral of $(V_r - V_{sw})$. For a buck converter $V_r$ can take values between 0 and $V_{in}$. Assuming the average value of $V_r$ to be $V_{in}/2$, the average signal slope may be computed. The ramp slope is the ratio of the ramp amplitude to the switching cycle time. Assuming the ramp signal to be unity, the control signal Sig may be obtained as a scaled version of ELC.

$$Sig = \frac{2\left[ \int (Vr-Vsw)dt + R(C_1(Vr-V_1) + C_2(Vr-V_2)) + (aVr+b\dot{V}r+c\ddot{V}r+d\dddot{V}r) \right]}{VinTs} \quad (19)$$

This feedback signal represents a feedback that is based on energy balance and uses voltage signals only for feedback. There is also a significant feedforward signal generated from the reference voltage, its derivatives and the nominal load impedance. The actual load impedance may vary from this quantity. This variation results in only a minor tracking error.

With respect to feedforward control, consider a buck converter with a four pole filter as shown in FIG. 11. The desired voltage at the output is defined to be $V_r$ and is a known variable. This value is continuous and differentiable to an arbitrary order. The load current is known nominally. The values of the inductances and capacitances are known and constant. Further, all voltages are considered measurable, and all the currents are not measurable. The voltage that is directly controllable independent of the filter delay is the switch voltage $V_{sw}$. The switch voltage is set directly by the PWM action. A reference voltage $V_{ff}$ can be defined as the reference voltage for this node.

$$Vff = Vr_1 + L_1 \dot{I}r_1 = V + L_2\left(\frac{\dot{V}r}{R} + C_2 \ddot{V}r\right) + \quad (20)$$
$$L_1 \frac{d}{dt}\left(\frac{Vr}{R} + \dot{V}r(C_1+C_2) + \frac{\ddot{V}r}{R}L_2 C_1 + L_2 C_1 C_2 \dddot{V}r\right)$$

To maintain a fixed switching frequency a conventional PWM circuit is used. The PWM analog control signal (Sig) is chosen to drive the voltage at the switch node $V_{sw}$ to be equal to $V_{ff}$. In presence of the switching noise this can be done in an integral sense such that the integral of $V_{sw}$ tracks the integral of $V_{ff}$. Thus, Sig is defined by the following equation.

$$Sig \int (Vff-Vsw)dt \quad (21)$$

In steady state the slope of Sig is determined almost completely by the integral of the switching voltage $V_{sw}$. Assuming the average value of $V_r$ to be $V_{in}/2$, the average signal slope can be computed. The ramp slope is the ratio of the ramp amplitude to the switching cycle time. Assuming the ramp signal to be unity, the control signal Sig is scaled to meet the equal slope criteria. The expression is computed in feedforward fashion as follows.

$$Sig = \frac{\int\left((Vr-Vsw) + \frac{d}{dt}(aVr+b\dot{V}r+c\ddot{V}r+d\dddot{V}r)\right)dt}{\frac{VinTs}{2}} \quad (22)$$

where the coefficients a, b, c and d are given by the following equations:

$$a = \frac{(L_2+L_1)}{R} \quad \text{and} \quad b = L_1(C_1+C_2) + L_2 C_2 \quad (23)$$

$$c = \frac{L_1 L_2 C_1}{R} \quad \text{and} \quad d = L_1 L_2 C_1 C_2 \quad (24)$$

This feedback signal represents a feedforward only system that uses the switching voltage only for control. The actual inductance, capacitance and load impedance may vary from their nominal values. These variations would result in tracking errors.

Computing higher order derivatives increases system complexity and noise sensitivity. Signal approximations may be taken that eliminate the terms corresponding to c and d. Corrections to a and b compensate in the following manner. The nominal angular frequency $\omega_{nom}$ is chosen in the center of the signal spectrum. The fourth order derivative can be approximated in terms of the second order derivative by using this nominal frequency. Similarly, the third order derivative can be approximated by the first order derivative using the nominal frequency.

$$a' = a - c(\omega_{nom})^2 \text{ and } b' = b - d(\omega_{nom})^2 \quad (25)$$

The expression for the feedforward voltage $V_{ff}$ in time domain is thus simplified to:

$$Vff = Vr + a'\dot{V}r + b'\ddot{V}r \quad (26)$$

The output RF envelope is required to track the input RF envelope. Since the RF PA is not a linear device, even if the exact envelope is generated at the switcher output, the RF output envelope of the PA is not exact. This nonlinearity results in spectral growth of the RF signal which is undesirable. To linearize the RF PA, an output detector can be used to feedback the output RF envelope to the feedforward-feedback control unit. Since the RF PA is a high speed device, the time delay due to it is negligible compared to the switcher delay. The output RF envelope may be considered to be a scaled version of the switcher output voltage. Thus, the resulting system is the same as introducing output feedback into the control equation. Integral feedback has been chosen here to reduce the feedback at high frequencies.

$$Sig = \frac{\int (Vff - Vsw)dt + k\int (Vr - Vout)dt}{\frac{VinTs}{2}} \quad (27)$$

The addition of output feedback modifies the tracking performance of the power converter. The output filter was chosen to be a well behaved low pass filter with no ringing at start-up. This results in an optimal tracking response. To maintain the same performance, the filter components can be adjusted to obtain the same performance with output feedback. The switch voltage ($V_{sw}$) is expressed in terms of the output voltage resulting in the following equation:

$$Sig = \frac{\int ((Vr - Vout)(1 + k) + a(\dot{V}r - \dot{V}out) + b(\ddot{V}r - \ddot{V}out) + c(\ddot{V}r - \ddot{V}out) + d(\dddot{V}r - \dddot{V}out))dt}{\frac{VinTs}{2}} \quad (28)$$

A modified low pass filter with components L1', C1', L2', C2' has to be designed to have the overall response as the original filter with no output feedback. Equating the terms in the above equation to the case with no output feedback, the following equations are obtained.

$$L_1' + L_2' = (L_1 + L_2)(1+k) \text{ and } L_1'(C_1' + C_2') + L_2'C_2' = (L_1(C_1 + C_2) + L_2C_2)(1+k) \quad (29)$$

$$L_1'C_1'C_2' = (L_1C_1C_2)(1+k) \text{ and } L_1'L_2'C_1'C_2' = (L_1L_2C_1C_2)(1+k) \quad (30)$$

Solving the simultaneous equations, the following modifications for C1 and L1 are obtained, while C2 and L2 remain unchanged.

$$L_1' = L_1(1+k) + kL_2 \text{ and } C_1' = \frac{C_1L_1(1+k)}{L_1(1+k) + kL_2} \quad (31)$$

The typical value for k is approximately unity. This weights the RF output envelope about the same as the switching voltage. This results in significant linearization of the RF output. Larger value for k are possible but result in large changes in the output filter. The output ripple is further reduced by a factor of (1+k) which corresponds to 6 dB for the case when k is unity.

For the output filter design, consider a fourth order Legendre filter normalized for an output impedance of 3Ω at 160 kHz. The component values are as follows. L1=4.81 µH, L2=4.27 µH, C1=0.551 µF, C2=0.212 µF. Using the above transformation for output feedback the L1,C1 values are changed to L1=13.89 µH and C1=0.3816 µF.

$$\text{Attenuation} \approx \left(\frac{2\pi}{Ts}\right)^4 (L1C1L2C2) \quad (32)$$

For a 800 kHz switching frequency, the attenuation of the switching frequency is 69.7 dB. The rms switching frequency signal at the input of the filter is approximately $V_{in}/4$. The average DC signal is $V_{in}/2$. Thus, there is a further 6 dB of separation between the desired signal and the switching frequency at the input of the filter. This brings the switching frequency power to 75.7 dB, which meets the 71.5 dB requirement. Any power supply rejection ratio (PSRR) of the RF power amplifier further suppresses the switching frequency.

In control implementation the first and second order derivatives are computed in discrete time using numerical differentiation formulae. While higher order formulae exist, for a limited word size, the best performance is achieved by using the simplest formulae. Since the successive envelope data is available, the derivatives may be evaluated using both present and past data. A time delay is introduced as a result and may be offset by delaying the baseband (I,Q) data, thus introducing the same delay in the RF signal path.

Setting k to unity and combining the reference and feedforward variables further simplifies the analysis. Combining the reference and the feedforward voltages allows the baseband computation to be summed as a single variable. In a digital implementation this reduces the number of digital to analog converters from two to one.

$$Sig = \frac{\int [(Vr + Vff) - (Vsw + Vout)]dt}{\frac{VinTs}{2}} \quad (33)$$

Going from continuous time equations to discrete time equations, the following equation is obtained:

$$Vcont = \frac{(Vr + Vff)}{2} = Vr + \frac{a'\dot{V}r + b'\ddot{V}r}{2} \quad (34)$$

$$= Vr(n) + \frac{a'}{2}\left(\frac{Vr(n+1) - Vr(n-1)}{2Ts}\right) + \frac{b'}{2}\left(\frac{Vr(n+1) + Vr(n-1) - 2Vr(n)}{Ts^2}\right)$$

The results may be evaluated in discrete time coefficients as follows. The values for the discrete time coefficients are then evaluated for the given filter.

$$Vcont = z_2Vr(n-1) + z_1Vr(n) + z_0Vr(n+1) \quad (35)$$

$$z_2 = -\frac{a'}{4Ts} + \frac{b'}{2Ts^2}; z_1 = 1 - \frac{b'}{Ts^2}; z_0 = \frac{a'}{4Ts} + \frac{b'}{2Ts^2} \quad (36)$$

This is an all zero transformation. For the given output filter the discrete time coefficients are as follows: z0=2.806674; z1=−2.716652; z2=0.909979.

Consider the simplified case where $V_{ref}$ is used instead of $V_{cont}$.

$$Sig = \frac{\int [(2Vcont) - (Vsw + Vout)]dt}{\frac{VinTs}{2}} \quad (37)$$

$$= \int \frac{(2Vr - Vsw - Vout)dt}{\frac{VinTs}{2}}$$

Expressing $V_{sw}$ in terms of $V_{out}$, the following expression is obtained:

$$Sig = \int \frac{(Vr - Vout + Vr - Vout(1 + as + bs^2 + cs^3 + ds^4))}{\frac{VinTs}{2}} dt \quad (38)$$

The coefficients 1,a,b,c,d correspond to the modified Legendre polynomial. However, they may be expressed in terms of the original Legendre polynomial as follows.

$$Sig = \int \frac{2\left(Vr - Vout\left(1 + \frac{a}{2}s + \frac{b}{2}s^2 + \frac{c_s}{2}s^3 + \frac{d}{2}s^4\right)\right)}{\frac{VinTs}{2}} dt \quad (39)$$

From earlier analysis it is known that the coefficients 1,a/2, b/2,c/2,d/2 correspond to the unmodified Legendre polynomial. Due to the switcher action, the value of Sig is driven to a small quantity between zero and unity. This implies that the integrand must be driven to zero. Thus, the output $V_{out}$ must be equal to a filtered version of $V_r$.

$$Vout = \frac{Vr}{\left(1 + \frac{a}{2}s + \frac{b}{2}s^2 + \frac{c}{2}s^3 + \frac{d}{2}s^4\right)} \quad (40)$$

Thus, the system response is driven to a filtered version of the reference voltage. The original Legendre filter has a 3 dB frequency of 160 kHz. This allows the envelope to pass through unchanged. However, any noise due to sampling at 400 kHz is suppressed. There is more than an octave frequency difference, so more than 24 dB suppression of the 400 kHz noise is expected.

For Feedforward Feedback Control consider a boost converter with a four pole filter. A key difference from the buck converter is that the inductor L1 is on the source side of the switch. Thus, the partitioning has the output inductor, the output capacitor and the load on the passive side of the partition. The other capacitor, the input inductor and the switch form the partition that is directly controlled. The control scheme here is to control the voltage at the input capacitor C1 to its desired value. This sets the output voltage at the capacitor C2 to follow the reference voltage. The ideal current flowing through inductor L1 is different from the buck converter case. The current through L1 is only partially transferred to C1. The remaining current is dumped to ground. It is possible to obtain an approximate value for this current by defining an average voltage boost ratio (k). The voltage transfer ratio also determines approximately the current transfer ratio neglecting power loss in the converter.

$$Ir_1 = (Ir_2 + C_1(\dot{V}r_1))k \quad (41)$$

$$= \left(\frac{Vr}{R} + \dot{V}r(C_1 + C_2) + \frac{\dot{V}r}{R}L_2C_1 + L_2C_1C_2\ddot{V}r\right)k$$

In this converter the capacitor voltage $V_{c1}$ is to be maintained at $V_{r1}$ and the inductor current is to be maintained at $I_{r1}$. The current flowing through an inductor is an integral of the voltage across it divided by the inductance. The inductor current can be estimated as:

$$-L_1I_1 = \int (Vsw - Vin)dt \quad (42)$$

Proportional and integral (PI) feedback is often used in switched power converters to drive the output voltage to its reference value. Here the voltage can be driven to $V_{r1}$ and current to $I_{r1}$ by setting the current equal to the reference current with PI feedback.

The analog control signal to the PWM circuit is chosen such that it drives the inductor current to its desired reference value. This signal may be constructed in terms of intermediate voltages and the reference voltage. The overall signal may be represented as follows, where the coefficients α, β are chosen for stability and performance, the estimate for the current is substituted and the resulting expression is as follows.

$$Sig = \frac{\left[\int (Vsw - Vin + (Vr_1 - V_1)\alpha]dt + \beta(Vr_1 - V_1) + L_1 Ir_1\right]}{(k-1)VinTs} \quad (43)$$

The scaling factor is again chosen to drive the signal slope equal to the ramp slope, for a unity amplitude ramp, when the switch is off. In determining the signal slope it has been assumed that the estimate of the inductor current dominates the signal slope. This is on similar lines as the buck converter signal slope criteria.

The following expression links the capacitor voltage to its reference value and the control signal. The appropriate values for α and β may be obtained from the following analysis.

$$L_1(I_1 - Ir_1) = \alpha \int (Vr_1 - V_1)dt + \beta(Vr_1 - V_1) - Sig(k-1)VinTs = kL_1(C_1(\dot{V}_1 - \dot{V}r_1)) \quad (44)$$

$$(kL_1C_1)(\dot{V}_1 - \dot{V}r_1) + \alpha \int (Vr_1 - V_1)dt + \beta(Vr_1 - V_1) = Sig(k-1)VinTs \quad (45)$$

The relation between α and β is chosen such that the poles are at a 30 degree angle from the real axis. This results in a constant delay two pole filter.

$$\alpha = \frac{\beta^2}{3kL1C1} \quad (46)$$

The value of β is determined such that in steady state the control signal slope is dominated by the estimate of the inductor current. The expression for the control signal Sig is thus reduced to the following equation.

$$Sig = \frac{\int \left(Vsw - Vin + \frac{\beta^2}{3kL1C1}(Vr_1 - V_1)\right)dt + L_1 Ir_1 + \beta(Vr_1 - V_1)}{(k-1)VinTs} \quad (47)$$

The values for α and β determine the poles of the closed loop system response. To obtain a high slew rate the values of L1 and C1 are chosen to be relatively small.

With respect to stability analysis of Feedforward Feedback Control, the transfer function of a switched power converter is a function of the duty ratio. To do a stability analysis, consider a small signal model of the converter operating at or close to the nominal value of the duty ratio. The system is stable provided the analog control signal Sig has no oscillations and α and β are chosen to realize a stable two pole filter. Typically, inappropriate choice of α and β result in a subharmonic instability of Sig. The following analysis is to determine largest value of α and β that will result in a stable system.

The subharmonic stability analysis is based on a discrete time model of the PWM process. The duty ratio in a given cycle is affected by the previous cycle in the following manner.

$$D(n+1) = \left(\frac{S_R - S_F}{S_R - S_N}\right)D(n) + \frac{S_F}{S_R - S_N} \quad (48)$$

where SR is the ramp slope, SN is the signal slope with the switch on, and SF is the signal slope with the switch off. From the above equation it is clear that the condition for stability is that the pole magnitude be less than unity. The equal slope criteria is chosen such that the Z-domain pole be at zero. However, this criteria is chosen by neglecting the higher order terms. Here, the effect of the higher order terms is considered, and it is ensured that the pole is limited to less than unity for all points. The following approximate values of SR, SN and SF are obtained during a steady state condition. Note that the derivative of the capacitor voltage is proportional to the current flowing into it.

$$S_N = \frac{[(-Vin) + (-\beta)\dot{V}_1]}{(k-1)VinTs} \quad (49)$$

$$= \frac{\left[-1 + \frac{\beta I_2}{C_1 Vin}\right]}{(k-1)Ts}$$

$$= \frac{-1}{(k-1)Ts} + \frac{\beta I_2}{(k-1)TsC_1 Vin}$$

$$S_F = \frac{[(kVin - Vin) + (-\beta)\dot{V}_1]}{(k-1)VinTs} \quad (50)$$

$$= \frac{\left[k - 1 + \frac{\beta(I_2 - I_1)}{C_1 Vin}\right]}{(k-1)Ts}$$

$$= \frac{1}{Ts} + \frac{\beta(I_2 - I_1)}{(k-1)TsC_1 Vin}$$

$$S_F = \frac{[(kVin - Vin) + (-\beta)\dot{V}_1]}{(k-1)VinTs} \quad (51)$$

$$= \frac{\left[k - 1 + \frac{\beta(I_2 - I_1)}{C_1 Vin}\right]}{(k-1)Ts}$$

$$= \frac{1}{Ts} + \frac{\beta(I_2 - I_1)}{(k-1)TsC_1 Vin}$$

$$S_R = \frac{1}{Ts} \quad (52)$$

Note that the effect of the integral feedback term has been neglected. This simplification is reasonable at high switching frequencies where the ripple at the capacitor C1 is negligible compared to the switching voltage waveform.

$$\frac{S_R - S_F}{S_R - S_N} = \frac{\frac{(-\beta)(I_2 - I_1)}{(k-1)TsC_1 Vin}}{\frac{1}{Ts}\left(\frac{-1}{(k-1)Ts} + \frac{\beta I_2}{(k-1)TsC_1 Vin}\right)} \quad (53)$$

$$= \frac{(-\beta)(I_2 - I_1)}{kC_1 Vin - \beta I_2} = \frac{\beta I_2(k-1)}{kC_1 Vin - \beta I_2}$$

$$= \frac{\beta(k-1)}{\frac{C_1 kVin}{I_2}\beta} = \frac{\beta(k-1)}{RC_1 - \beta}$$

The pole of the difference equation is chosen to be 0.2. This is a design parameter that must be less than 1 for stability.

$$\beta = \frac{0.2RC_1}{k} \quad (54)$$

The theoretical limit up to which a switching converter may track a signal is half the switching frequency by the Nyquist criteria. Tracking performance of the power converter with feedforward-feedback control comes close to the theoretical limit. At the same time, the switching frequency is suppressed by more than 70 dB. This results in a system that not only tracks the desired signals, but also meets the stringent noise requirements of most RF transmitters.

Conventionally, a boost converter is not considered a good candidate for transient performance. Here, a high speed control scheme has been introduced that allows excellent tracking while operating at a relatively low switching frequency and with low switching noise. In this control scheme the intermediate capacitor voltage is chosen as the quantity to be controlled. This voltage is controlled by feedback. A feedforward estimate of the load current based on the reference signal is used to translate the control of the intermediate voltage into the control of the output voltage. As in the buck converter, the choice of the state being controlled is not unique. Other possibilities exist, but the intermediate capacitor voltage is chosen for simplicity.

FIG. 13, numeral 1300, shows a schematic representation of the PWM converter as is known in the art. The control signal (1302) is used to determine the duty ratio of the switched power converter by resetting the switch at a variable time. The set time of the switch is determined by a synchronous clock (1304). While the small signal bandwidth is extended by appropriate control, the large signal bandwidth is limited by output filter design as well. However, the use of a higher order filter in a buck converter allows the tracking of large signal waveforms up to 80 kHz while switching at 1 MHz. The control scheme used here is the excess energy control.

The switcher efficiency may be kept above 90% for most applications. Using a custom IC implementation with optimally sized switches and by limiting the switching frequency, even higher switcher efficiency is possible. Thus, the power savings from the PA are not consumed by the switcher.

Figure 16:
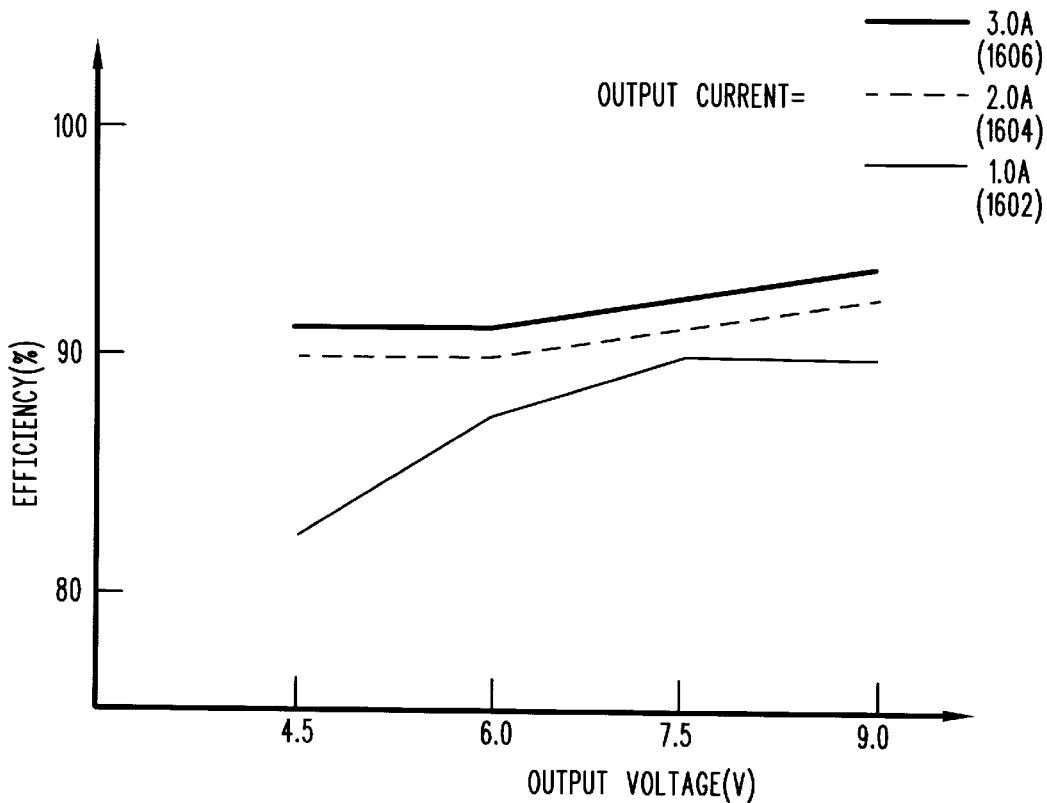
FIG. 16 shows a graphic representation of the experimental efficiency data for a step down power converter operating from a supply of 12V in accordance with the present invention.

FIG. 16, numeral 1600, shows a graphic representation of the experimental efficiency data for a step down power converter operating from a supply of 12V in accordance with the present invention. The switching frequency was chosen to be 450 kHz. The efficiencies at the load current of 1.0 Amp (1602), load current of 2.0 Amps (1604) and the load current of 3.0 Amps (1606) are in the neighborhood of 90%.

In conventional power control the boost converter has inferior dynamic performance due to its nonlinear operation characteristics. Here a control scheme has been implemented that allows the boost converter to track the envelope of a QPSK signal almost perfectly and with a constant delay. FIG. 20, numeral 2000, shows a graphic representation of the reference voltage (2004) and the output voltage (2002) in accordance with the present invention.

Figure 18:
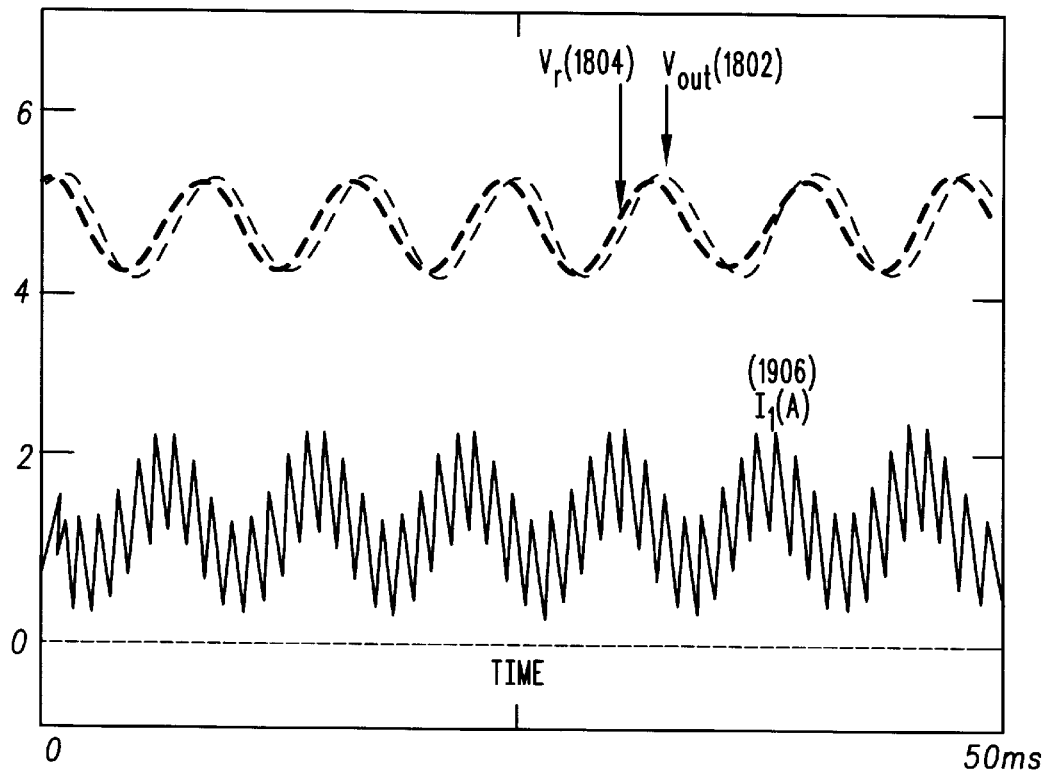
FIG. 18 shows a graphic representation of the tracking of a 125 kHz signal for a boost converter that is switching at 1 MHz in accordance with the present invention.
Figure 19:
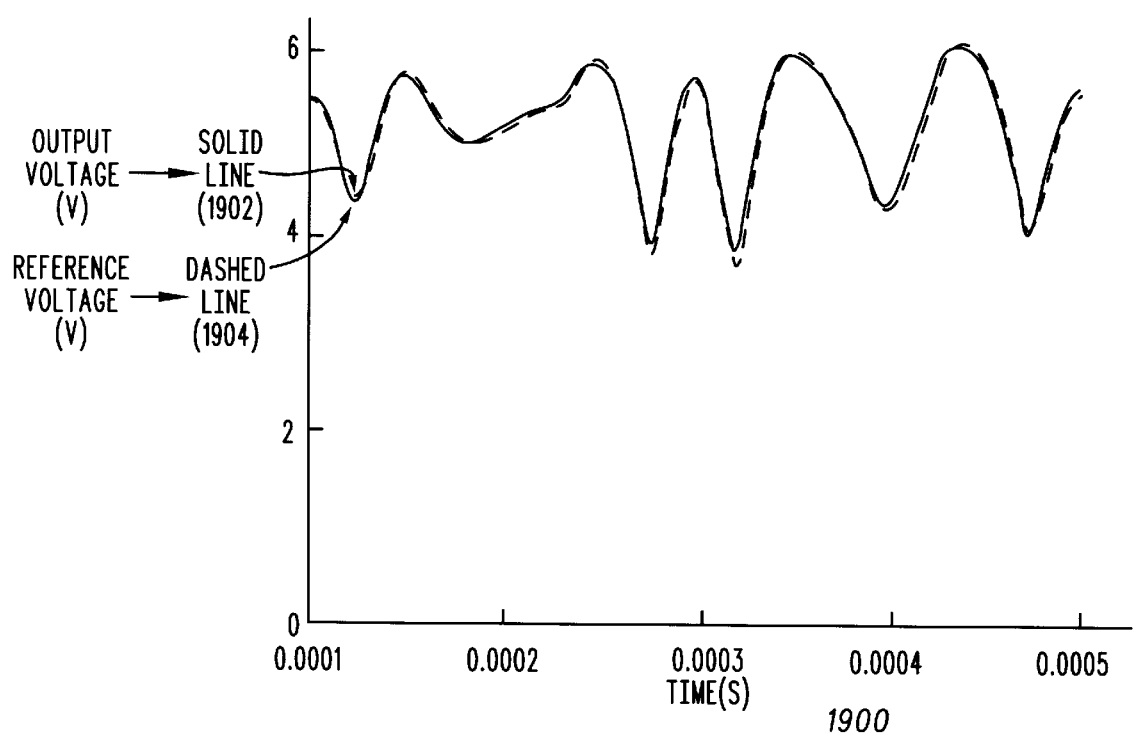
FIG. 19 shows a graphic representation of the reference voltage and the output voltage in accordance with the present invention.

In FIG. 18, numeral 1800, the tracking of a 125 kHz signal is shown for a boost converter that is switching at 1 MHz in accordance with the present invention. The output $V_{out}$ (1802) tracks the reference $V_r$ (1804) with a small delay. The inductor current $I_1$ (1806) shows a significant ripple. Again, the switching noise is attenuated by more than 60 dB. This result indicates that for a boost switcher the ratio of the switching frequency to the highest frequency that can be tracked well is only eight. This exceeds conventional boost converter performance significantly.

Figure 14:
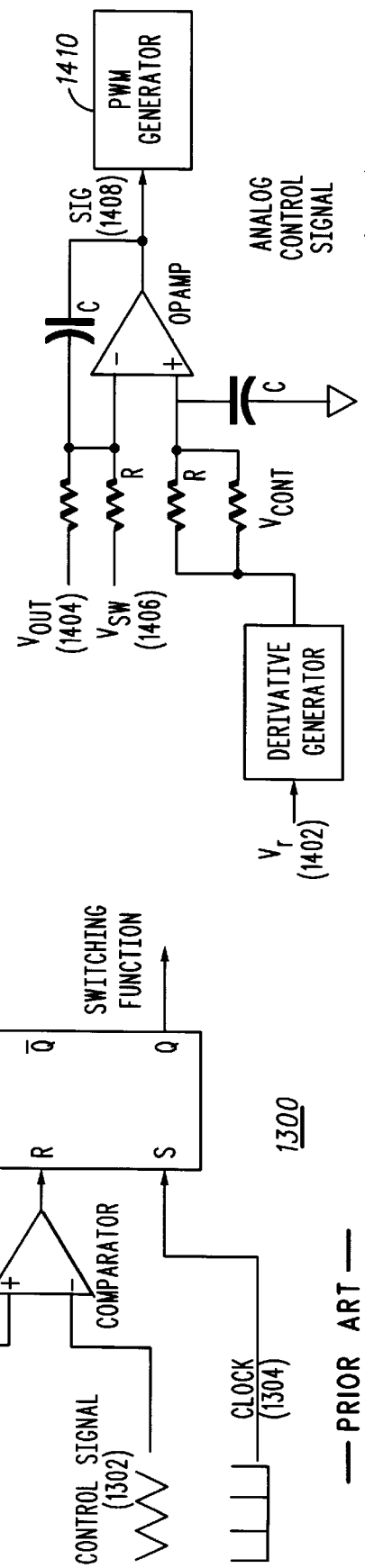
FIG. 14 shows a circuit diagram of the feedback system in accordance with the present invention.

Once the feedforward control voltage is developed the analog feedback part of the system is reduced to a single integrator. FIG. 14, numeral 1400, shows a circuit diagram of the feedback system in accordance with the present invention. This analog controller is readily realized in an analog application specific integrated circuit (ASIC). The reference voltage $V_r$ (1402), the output voltage Vout(1404), and the switch voltage $V_{sw}$ (1406) are used to create the analog signal Sig (1408). This signal goes to the PWM generator (1410).

A boost version of the envelope following converter serves two purposes. It obtains the power savings due to envelope following as well as operate a higher voltage PA from a lower voltage battery. Thus, it provides significant advantage in a radio unit operating on a 3.3 V battery (3 NiCd or Lithium Ion). It also provides the ability to run the same PA at two different voltages for digital and analog modes of operation.

FIG. 11, numeral 1100, shows a schematic representation of an embodiment of a buck converter with a four pole filter in accordance with the present invention. The buck converter operates from the input voltage (1102) and supplies an envelope voltage at the load (1104).

FIG. 12, numeral 1200, shows a schematic representation of an embodiment of a boost converter with a four pole filter in accordance with the present invention. The boost converter operates from the input voltage (1202) and supplies an envelope voltage at the load (1204).

Figure 15:
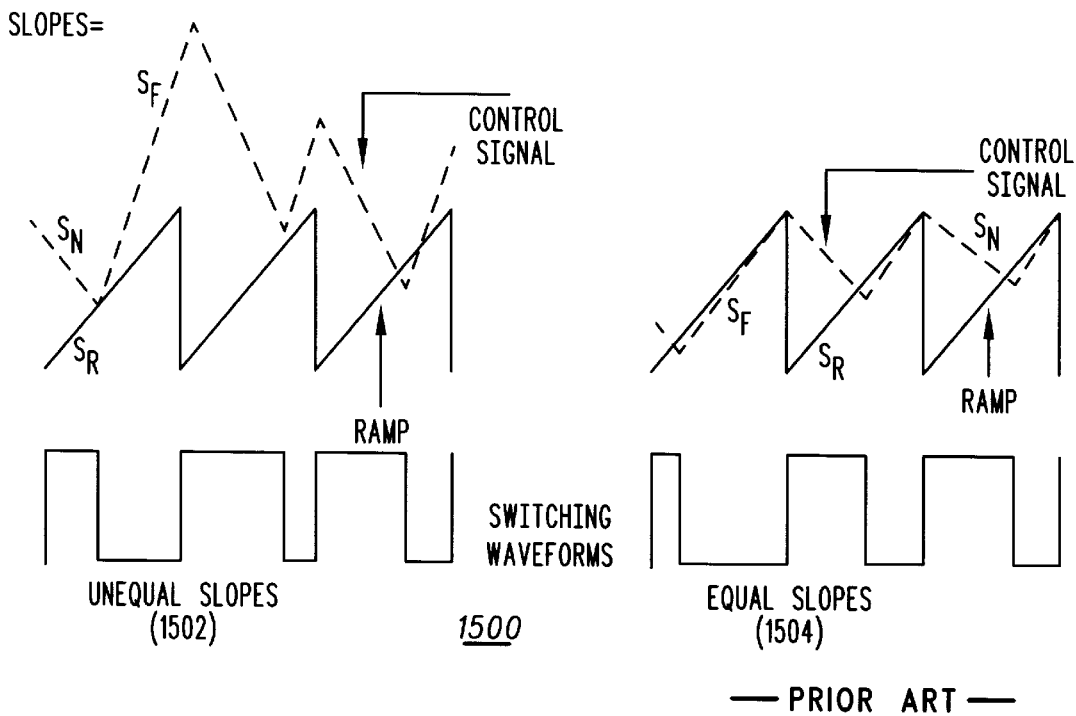
FIG. 15 shows a schematic representation of the effect of using the equal slope criteria for the control signal as is known in the prior art.

FIG. 15, numeral 1500, shows a schematic representation of the effect of using the equal slope criteria for the control signal as known in the prior art. The performance with unequal slopes (1502) is worse than the performance with equal slopes (1504).

Figure 17:
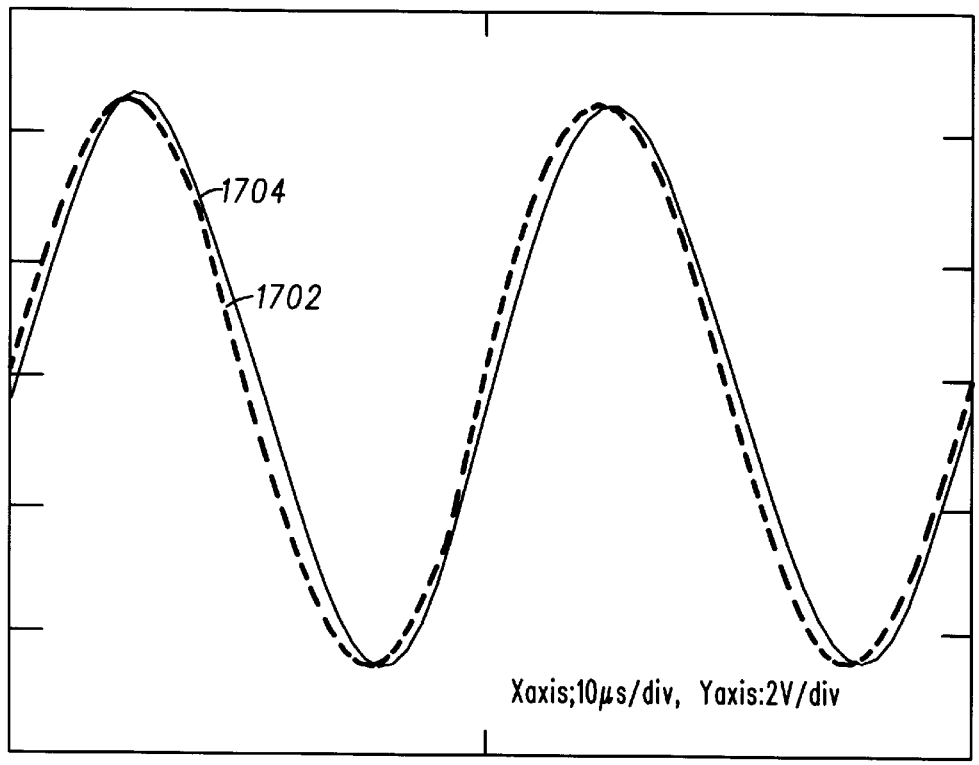
FIG. 17 shows a graphic representation of a large signal tracking of an 80 kHz sine wave using excess energy control in accordance with the present invention.

FIG. 17, numeral 1700, shows a graphic representation of a large signal tracking of an 80 kHz sine wave using excess energy control in accordance with the present invention. Waveforms show the reference voltage (1702) and the converter output voltage (1704).

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. A tracking power converter that provides efficient power amplification while generating a dynamic variable voltage output signal, comprising:

A) a feedforward feedback control unit, coupled to receive a reference signal and to receive at least one feedback signal, for determining an optimal control signal in accordance with a predetermined scheme;

B) a pulse width modulation unit, coupled to the feedforward feedback control unit, for modifying a duty ratio to provide a switching signal; and C) a power converter, coupled to the pulse width modulation unit and to a power source, for providing the dynamic variable voltage output signal.

2. The tracking power converter of claim 1 wherein the predetermined scheme of the feedforward feedback control unit utilizes an estimate of a load current based on the reference signal to determine the optimal control signal.

3. The tracking power converter of claim 1 wherein the predetermined scheme of the feedforward feedback control unit utilizes the reference signal and derivatives of the reference signal to determine the optimal control signal.

4. The tracking power converter of claim 3 wherein the reference signal is available in digital form, and the derivatives of the reference signal are computed using digital hardware.

5. The tracking power converter of claim 1 wherein the tracking power converter includes a filter of order greater than 2.

6. The tracking power converter of claim 1 wherein the tracking power converter includes a filter that is a low-pass filter of order greater than 2.

7. A device having a tracking power converter for providing an efficient linear power amplifier that generates a variable envelope radio frequency RF signal, the device comprising:

A) an efficient envelope following unit having an envelope mapping unit and the tracking power converter, wherein the tracking power converter is coupled to receive a reference signal from the envelope mapping unit, the efficient envelope folowing unit being coupled to receive a baseband signal, for outputting the variable output signal in accordance with an output of the envelope mapping unit;

B) a RF signal generator, coupled to receive the baseband signal and a RF reference signal, for providing a RF input signal with amplitude and phase information to a linear RF power amplifier; and C) the linear RF power amplifier, coupled to the efficient envelope following unit and to the RF signal generator, for outputting a power efficient amplified variable envelope RF signal with substantially a same amplitude and phase information as the RF input signal, wherein the tracking power converter includes:

D) a feedforward feedback control unit, coupled to receive the reference signal and to receive at least one feedback signal, for determining an optimal control signal in accordance with a predetermined scheme;

E) a pulse width modulation unit, coupled to the feedforward feedback control unit, for modifying a duty ratio to provide a switching signal; and F) a power converter, coupled to the pulse width modulation unit and to a power source, for providing the variable output signal.

8. The device of claim 7 wherein the linear RF power amplifier is a class AB amplifier.

9. The device of claim 7 wherein the linear RF power amplifier is a class B amplifier.

10. The device of claim 7 wherein the power converter further provides a feedback signal to the feedforward feedback control unit.

11. The device of claim 7 further including an envelope detector coupled to the linear RF power amplifier output wherein the envelope detector provides a feedback signal to the feedforward feedback control unit.

12. The device of claim 7 wherein the tracking power converter includes a filter of order greater than 2.

13. The device of claim 7 wherein the tracking power converter includes a filter that is an optimal low-pass filter of order greater than 2.

14. The device of claim 7 wherein the envelope mapping unit uses a polynomial mapping function of $I^2$ plus $Q^2$, which is a square of the envelope of the baseband signal to provide an implicitly bandlimited signal.

15. A method for providing an efficient linear power amplifier that generates a variable envelope radio frequency RF signal, comprising the steps of:
   A) utilizing an efficient envelope following unit for outputting a supply voltage in accordance with a variable envelope of an input baseband signal;
   B) providing, by a RF signal generator, based on the input baseband signal, a RF input signal with amplitude and phase information to a linear RF power amplifier; and
   C) utilizing a linear RF power amplifier that is coupled to the efficient envelope following unit and to the RF signal generator for outputting a power efficient amplified variable envelope RF signal with substantially a same amplitude and phase information as the RF input signal.

16. The method of claim 15 wherein utilizing the efficient envelope following unit includes:
   A) utilizing an optimal envelope calculator that receives the baseband signal to determine an optimum envelope for the baseband signal; and
   B) utilizing an envelope tracking power converter, where the envelope tracking power converter is coupled to the optimal envelope calculator, a power source and to receive a feedback signal, for outputting the supply voltage to the linear RF power amplifier.

17. The method of claim 16 wherein utilizing the envelope tracking power converter includes:
   A) utilizing a feedforward feedback control unit, where the feedforward feedback control unit is coupled to the optimal envelope calculator and to receive at least one feedback signal, for determining an optimal control signal in accordance with a predetermined scheme;
   B) utilizing a pulse width modulation unit, where the pulse width modulation unit is coupled to the feedforward feedback control unit, for modifying a pulse width to provide a constant frequency switching signal; and
   C) utilizing a power converter, where the power converter is coupled to the pulse width modulation unit and to the power source, for providing the supply voltage to the linear RF power amplifier.

18. The method of claim 15 wherein the linear RF power amplifier is a class AB amplifier.

19. The method of claim 15 wherein the linear RF power amplifier is a class B amplifier.

20. The method of claim 17 wherein utilizing the power converter includes providing a feedback signal to the feedforward feedback control unit.

21. The method of claim 17 wherein utilizing a linear RF power amplifier further includes providing an envelope detector coupled to the linear RF power amplifier output to provide a feedback signal to the feedforward feedback control unit.

22. The method of claim 16 wherein the envelope tracking power converter includes a filter of order greater than 2.

23. The method of claim 16 wherein the envelope tracking power converter includes a filter that is an optimal low-pass filter of order greater than 2.

24. The method of claim 16 wherein utilizing the optimal envelope calculator includes using a polynomial mapping function of $I^2$ plus $Q^2$, which is a square of an envelope of the baseband signal to provide an implicitly bandlimited signal.

25. A cellular phone having a system for providing an efficient linear power amplifier that generates a variable envelope radio frequency RF signal, the system comprising:
   device having a tracking power converter for providing an efficient linear power amplifier that generates a variable envelope radio frequency RF signal, the device comprising:
   A) an efficient envelope following unit having an envelope mapping unit and the tracking power converter, wherein the tracking power converter is coupled to receive a reference signal from the envelope mapping unit, the efficient envelope folowing unit being coupled to receive a baseband signal, for outputting the variable output signal in accordance with an output of the envelope mapping unit;
   B) a RF signal generator, coupled to receive the baseband signal and a RF reference signal, for providing a RF input signal with amplitude and phase information to a linear RF power amplifier; and
   C) the linear RF power amplifier, coupled to the efficient envelope following unit and to the RF signal generator, for outputting a power efficient amplified variable envelope RF signal with substantially a same amplitude and phase information as the RF input signal,
   wherein the tracking power converter includes:
   D) a feedforward feedback control unit, coupled to receive the reference signal and to receive at least one feedback signal, for determining an optimal control signal in accordance with a predetermined scheme;
   E) a pulse width modulation unit, coupled to the feedforward feedback control unit, for modifying a duty ratio to provide a switching signal; and
   F) a power converter, coupled to the pulse width modulation unit and to a power source, for providing the variable output signal.

26. The cellular phone of claim 25 wherein the efficient envelope following unit includes:
   A) an optimal envelope calculator, coupled to receive the baseband signal, for determining an optimum envelope for the baseband signal; and
   B) an envelope tracking power converter, coupled to the optimal envelope calculator, to a power source and to receive a feedback signal, for outputting a supply voltage to the linear RF power amplifier.

27. The cellular phone of claim 26 wherein the envelope tracking power converter includes:
   A) a feedforward feedback control unit, coupled to the optimal envelope calculator and to receive at least one feedback signal, for determining an optimal control signal in accordance with a predetermined scheme;
   B) a pulse width modulation unit, coupled to the feedforward feedback control unit, for modifying a pulse width to provide a constant frequency switching signal; and
   C) a power converter, coupled to the pulse width modulation unit and to the power source, for providing the supply voltage to the linear RF power amplifier.

28. A mobile radio having a system for providing an efficient linear power amplifier that generates a variable envelope radio frequency RF signal, the system comprising:

A) an efficient envelope following unit having an envelope mapping unit and the tracking power converter, wherein the tracking power converter is coupled to receive a reference signal from the envelope mapping unit, the efficient envelope folowing unit being coupled to receive a baseband signal, for outputting the variable output signal in accordance with an output of the envelope mapping unit;

B) a RF signal generator, coupled to receive the baseband signal and a RF reference signal, for providing a RF input signal with amplitude and phase information to a linear RF power amplifier; and C) the linear RF power amplifier, coupled to the efficient envelope following unit and to the RF signal generator, for outputting a power efficient amplified variable envelope RF signal with substantially a same amplitude and phase information as the RF input signal, wherein the tracking power converter includes:

D) a feedforward feedback control unit, coupled to receive the reference signal and to receive at least one feedback signal, for determining an optimal control signal in accordance with a predetermined scheme;

E) a pulse width modulation unit, coupled to the feedforward feedback control unit, for modifying a duty ratio to provide a switching signal; and F) a power converter, coupled to the pulse width modulation unit and to a power source, for providing the variable output signal.

29. The mobile radio of claim 28 wherein the efficient envelope following unit includes:

A) an optimal envelope calculator, coupled to receive the baseband signal, for determining an optimum envelope for the baseband signal; and B) an envelope tracking power converter, coupled to the optimal envelope calculator, to a power source and to receive a feedback signal, for outputting a supply voltage to the linear RF power amplifier.

30. The mobile radio of claim 29 wherein the envelope tracking power converter includes:

A) a feedforward feedback control unit, coupled to the optimal envelope calculator and to receive at least one feedback signal, for determining an optimal control signal in accordance with a predetermined scheme;

B) a pulse width modulation unit, coupled to the feedforward feedback control unit, for modifying a pulse width to provide a constant frequency switching signal; and C) a power converter, coupled to the pulse width modulation unit and to the power source, for providing the supply voltage to the linear RF power amplifier.

31. A satellite phone having a system for providing an efficient linear power amplifier that generates a variable envelope radio frequency RF signal, the system comprising:

A) an efficient envelope following unit having an envelope mapping unit and the tracking power converter, wherein the tracking power converter is coupled to receive a reference signal from the envelope mapping unit, the efficient envelope folowing unit being coupled to receive a baseband signal, for outputting the variable output signal in accordance with an output of the envelope mapping unit;

B) a RF signal generator, coupled to receive the baseband signal and a RF reference signal, for providing a RF input signal with amplitude and phase information to a linear RF power amplifier; and C) the linear RF power amplifier, coupled to the efficient envelope following unit and to the RF signal generator, for outputting a power efficient amplified variable envelope RF signal with substantially a same amplitude and phase information as the RF input signal, wherein the tracking power converter includes:

D) a feedforward feedback control unit, coupled to receive the reference signal and to receive at least one feedback signal, for determining an optimal control signal in accordance with a predetermined scheme;

E) a pulse width modulation unit, coupled to the feedforward feedback control unit, for modifying a duty ratio to provide a switching signal; and F) a power converter, coupled to the pulse width modulation unit and to a power source, for providing the variable output signal.

32. The satellite phone of claim 31 wherein the efficient envelope following unit includes:

A) an optimal envelope calculator, coupled to receive the baseband signal, for determining an optimum envelope for the baseband signal; and B) an envelope tracking power converter, coupled to the optimal envelope calculator, to a power source and to receive a feedback signal, for outputting a supply voltage to the linear RF power amplifier.

33. The satellite phone of claim 31 wherein the envelope tracking power converter includes:

A) a feedforward feedback control unit, coupled to the optimal envelope calculator and to receive at least one feedback signal, for determining an optimal control signal in accordance with a predetermined scheme;

B) a pulse width modulation unit, coupled to the feedforward feedback control unit, for modifying a pulse width to provide a constant frequency switching signal; and C) a power converter, coupled to the pulse width modulation unit and to the power source, for providing the supply voltage to the linear RF power amplifier.

34. A radio telephone having a system for providing an efficient linear power amplifier that generates a variable envelope radio frequency RF signal, the system comprising:

A) an efficient envelope following unit having an envelope mapping unit and the tracking power converter, wherein the tracking power converter is coupled to receive a reference signal from the envelope mapping unit, the efficient envelope folowing unit being coupled to receive a baseband signal, for outputting the variable output signal in accordance with an output of the envelope mapping unit;

B) a RF signal generator, coupled to receive the baseband signal and a RF reference signal, for providing a RF input signal with amplitude and phase information to a linear RF power amplifier; and C) the linear RF power amplifier, coupled to the efficient envelope following unit and to the RF signal generator, for outputting a power efficient amplified variable envelope RF signal with substantially a same amplitude and phase information as the RF input signal, wherein the tracking power converter includes:

D) a feedforward feedback control unit, coupled to receive the reference signal and to receive at least one feedback signal, for determining an optimal control signal in accordance with a predetermined scheme;

E) a pulse width modulation unit, coupled to the feedforward feedback control unit, for modifying a duty ratio to provide a switching signal; and F) a power converter, coupled to the pulse width modulation unit and to a power source, for providing the variable output signal.

35. The radio telephone of claim 34 wherein the efficient envelope following unit includes:

A) an optimal envelope calculator, coupled to receive the baseband signal, for determining an optimum envelope for the baseband signal; and B) an envelope tracking power converter, coupled to the optimal envelope calculator, to a power source and to receive a feedback signal, for outputting a supply voltage to the linear RF power amplifier.

36. The radio telephone of claim 34 wherein the envelope tracking power converter includes:

A) a feedforward feedback control unit, coupled to the optimal envelope calculator and to receive at least one feedback signal, for determining an optimal control signal in accordance with a predetermined scheme;

B) a pulse width modulation unit, coupled to the feedforward feedback control unit, for modifying a pulse width to provide a constant frequency switching signal; and C) a power converter, coupled to the pulse width modulation unit and to the power source, for providing the supply voltage to the linear RF power amplifier.

37. A base station having a system for providing an efficient linear power amplifier that generates a variable envelope radio frequency RF signal, the system comprising:

A) an efficient envelope following unit having an envelope mapping unit and the tracking power converter, wherein the tracking power converter is coupled to receive a reference signal from the envelope mapping unit, the efficient envelope folowing unit being coupled to receive a baseband signal, for outputting the variable output signal in accordance with an output of the envelope mapping unit;

B) a RF signal generator, coupled to receive the baseband signal and a RF reference signal, for providing a RF input signal with amplitude and phase information to a linear RF power amplifier; and C) the linear RF power amplifier, coupled to the efficient envelope following unit and to the RF signal generator, for outputting a power efficient amplified variable envelope RF signal with substantially a same amplitude and phase information as the RF input signal, wherein the tracking power converter includes:

D) a feedforward feedback control unit, coupled to receive the reference signal and to receive at least one feedback signal, for determining an optimal control signal in accordance with a predetermined scheme;

E) a pulse width modulation unit, coupled to the feedforward feedback control unit, for modifying a duty ratio to provide a switching signal; and F) a power converter, coupled to the pulse width modulation unit and to a power source, for providing the variable output signal.

38. The base station of claim 37 wherein the efficient envelope following unit includes:

A) an optimal envelope calculator, coupled to receive the baseband signal, for determining an optimum envelope for the baseband signal; and B) an envelope tracking power converter, coupled to the optimal envelope calculator, to a power source and to receive a feedback signal, for outputting a supply voltage to the linear RF power amplifier.

39. The base station of claim 37 wherein the envelope tracking power converter includes:

A) a feedforward feedback control unit, coupled to the optimal envelope calculator and to receive at least one feedback signal, for determining an optimal control signal in accordance with a predetermined scheme;

B) a pulse width modulation unit, coupled to the feedforward feedback control unit, for modifying a pulse width to provide a constant frequency switching signal; and C) a power converter, coupled to the pulse width modulation unit and to the power source, for providing the supply voltage to the linear RF power amplifier.

40. A multi-mode radio telephone having a system for providing an efficient linear power amplifier that generates at least a variable envelope radio frequency RF signal, the system comprising:

A) an efficient envelope following unit having an envelope mapping unit and the tracking power converter, wherein the tracking power converter is coupled to receive a reference signal from the envelope mapping unit, the efficient envelope folowing unit being coupled to receive a baseband signal, for outputting the variable output signal in accordance with an output of the envelope mapping unit;

B) a RF signal generator, coupled to receive the baseband signal and a RF reference signal, for providing a RF input signal with amplitude and phase information to a linear RF power amplifier; and C) the linear RF power amplifier, coupled to the efficient envelope following unit and to the RF signal generator, for outputting a power efficient amplified variable envelope RF signal with substantially a same amplitude and phase information as the RF input signal, wherein the tracking power converter includes:

D) a feedforward feedback control unit, coupled to receive the reference signal and to receive at least one feedback signal, for determining an optimal control signal in accordance with a predetermined scheme;

E) a pulse width modulation unit, coupled to the feedforward feedback control unit, for modifying a duty ratio to provide a switching signal; and F) a power converter, coupled to the pulse width modulation unit and to a power source, for providing the variable output signal.

41. A method for providing a tracking power converter that provides efficient power amplification while generating a dynamic variable voltage output signal, comprising the steps of:

A) determining a feedforward-feedback control signal in accordance with a predetermined scheme using a reference signal and at least one feedback signal;

B) modifying a duty ratio to provide a switching signal; and

C) providing the dynamic variable voltage output signal.

42. The method of claim 41 wherein the predetermined scheme includes utilizing an estimate of a load current based on the reference signal to determine the feedforward-feedback control signal.

43. The method of claim 41 wherein the predetermined scheme includes utilizing the reference signal and derivatives of the reference signal to determine the feedforward-feedback control signal.

44. The method of claim 41 wherein the reference signal is available in digital form, and the derivatives of the reference signal are computed using digital hardware.

45. The method of claim 41 wherein providing the dynamic variable output signal includes using a filter of order greater than 2.

* * * * *